United States Patent
Lee et al.

(10) Patent No.: US 12,057,441 B2
(45) Date of Patent: Aug. 6, 2024

(54) SEMICONDUCTOR PACKAGE INCLUDING A PLURALITY OF SEMICONDUCTOR CHIPS

(71) Applicant: SAMSUNG ELECTRONICS CO., LTD., Suwon-si (KR)

(72) Inventors: Manho Lee, Hwaseong-si (KR); Eunseok Song, Hwaseong-si (KR); Kyungsuk Oh, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 17/648,549

(22) Filed: Jan. 21, 2022

(65) Prior Publication Data

US 2022/0352128 A1    Nov. 3, 2022

(30) Foreign Application Priority Data

Apr. 28, 2021   (KR) .................. 10-2021-0055052

(51) Int. Cl.
*H01L 25/10*     (2006.01)
*H01L 23/00*     (2006.01)
(Continued)

(52) U.S. Cl.
CPC .......... *H01L 25/105* (2013.01); *H01L 23/481* (2013.01); *H01L 23/49816* (2013.01); *H01L 23/49822* (2013.01); *H01L 24/16* (2013.01); *H01L 24/17* (2013.01); *H01L 24/24* (2013.01); *H01L 24/73* (2013.01); *H01L 2224/16145* (2013.01); *H01L 2224/16227* (2013.01);
(Continued)

(58) Field of Classification Search
CPC ............ H01L 23/481; H01L 23/49816; H01L 23/49822; H01L 24/16; H01L 24/17; H01L 24/24
See application file for complete search history.

(56) References Cited

U.S. PATENT DOCUMENTS 9,331,062 B1   6/2016 Lane et al.
9,589,903 B2   3/2017 Chen et al.
(Continued)

FOREIGN PATENT DOCUMENTS

EP           3324438        5/2018

*Primary Examiner* — Nathan W Ha
(74) *Attorney, Agent, or Firm* — F. Chau & Associates, LLC

(57) ABSTRACT

A semiconductor package includes a lower redistribution layer, a lower semiconductor chip and a plurality of conductive connection structures attached to the lower redistribution layer. An upper redistribution layer is disposed on the lower semiconductor chip and the plurality of conductive connection structures. An upper semiconductor chip has an active plane corresponding to an active plane of the lower semiconductor chip and is disposed on the upper redistribution layer. The lower semiconductor chip includes a semiconductor substrate having a first surface and a second surface opposite to the first substrate. An upper wiring structure is disposed on the first surface of the semiconductor substrate. A buried power rail fills a portion of a buried rail hole extending from the first surface toward the second surface. A through electrode fills a through hole extending from the second surface toward the first surface.

20 Claims, 23 Drawing Sheets

(51) Int. Cl.
H01L 23/48 (2006.01)
H01L 23/498 (2006.01)

(52) U.S. Cl.
CPC ............... *H01L 2224/16235* (2013.01); *H01L 2224/171* (2013.01); *H01L 2224/24145* (2013.01); *H01L 2224/73259* (2013.01); *H01L 2924/13067* (2013.01)

(56) References Cited

U.S. PATENT DOCUMENTS

| | | | |
|---|---|---|---|
| 9,768,133 B1 | 9/2017 | Wu et al. | |
| 10,109,541 B2 | 10/2018 | Baek et al. | |
| 10,636,719 B2 | 4/2020 | Byene et al. | |
| 11,721,628 B2 * | 8/2023 | Kim | H01L 23/5286 257/382 |
| 11,728,347 B2 * | 8/2023 | Kim | H01L 21/76898 257/350 |
| 11,742,292 B2 * | 8/2023 | Van Dal | H01L 21/743 257/401 |
| 11,749,587 B2 * | 9/2023 | Kim | H01L 23/481 257/365 |
| 11,830,821 B2 * | 11/2023 | Chen | H01L 25/105 |
| 2012/0292777 A1 | 11/2012 | Lotz | |
| 2018/0350762 A1 | 12/2018 | Gu et al. | |
| 2018/0358292 A1 | 12/2018 | Kong et al. | |
| 2019/0378790 A1 * | 12/2019 | Bohr | H01L 23/485 |
| 2020/0091072 A1 | 3/2020 | Naser et al. | |
| 2020/0135645 A1 | 4/2020 | Rubin et al. | |
| 2021/0028112 A1 * | 1/2021 | Kim | H01L 29/41791 |
| 2021/0043561 A1 * | 2/2021 | Kim | H01L 21/76895 |
| 2021/0375722 A1 * | 12/2021 | Kim | H01L 21/823431 |
| 2021/0375861 A1 * | 12/2021 | Chung | H01L 29/785 |
| 2022/0293483 A1 * | 9/2022 | Tsai | H01L 24/73 |
| 2022/0302065 A1 * | 9/2022 | Cho | H01L 23/295 |
| 2023/0013764 A1 * | 1/2023 | Chou | H01L 29/41725 |
| 2023/0253293 A1 * | 8/2023 | Cho | H01L 29/66439 257/732 |
| 2023/0352410 A1 * | 11/2023 | Kim | H01L 29/66795 |

* cited by examiner

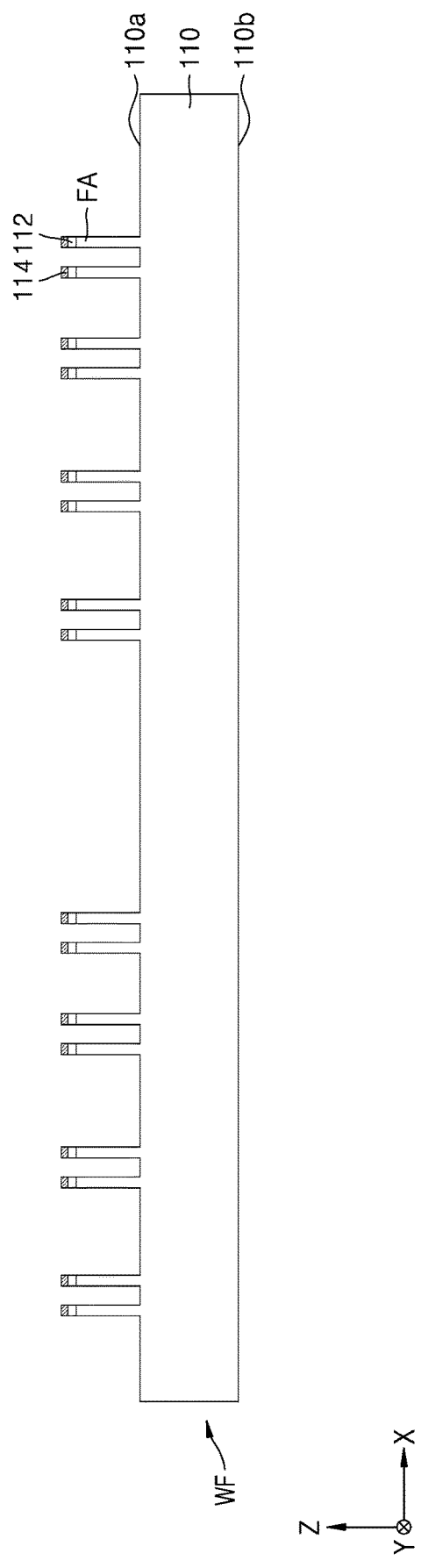
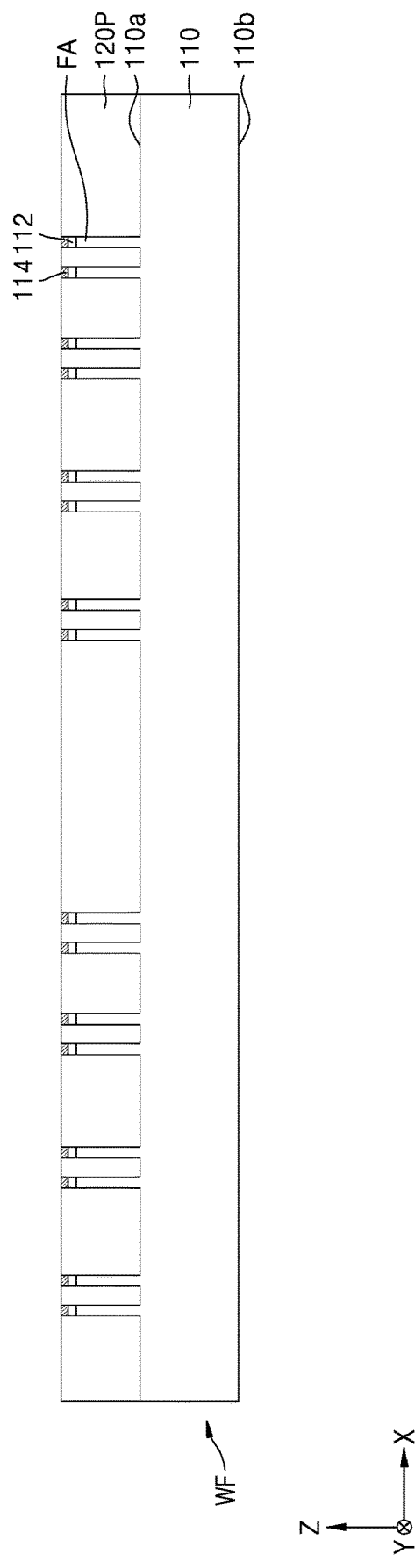
FIG. 2A
FIG. 2B

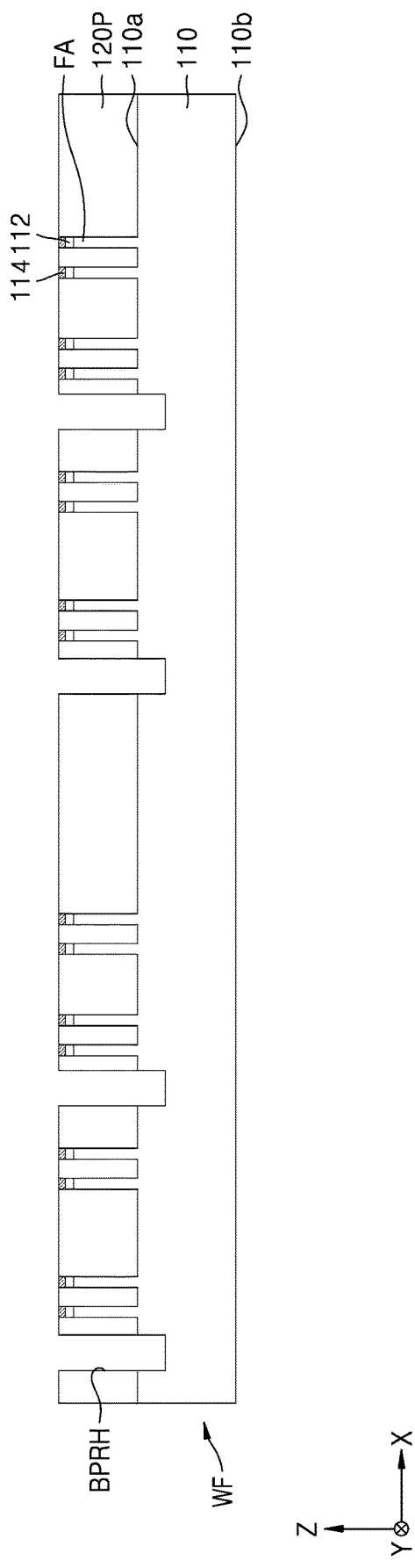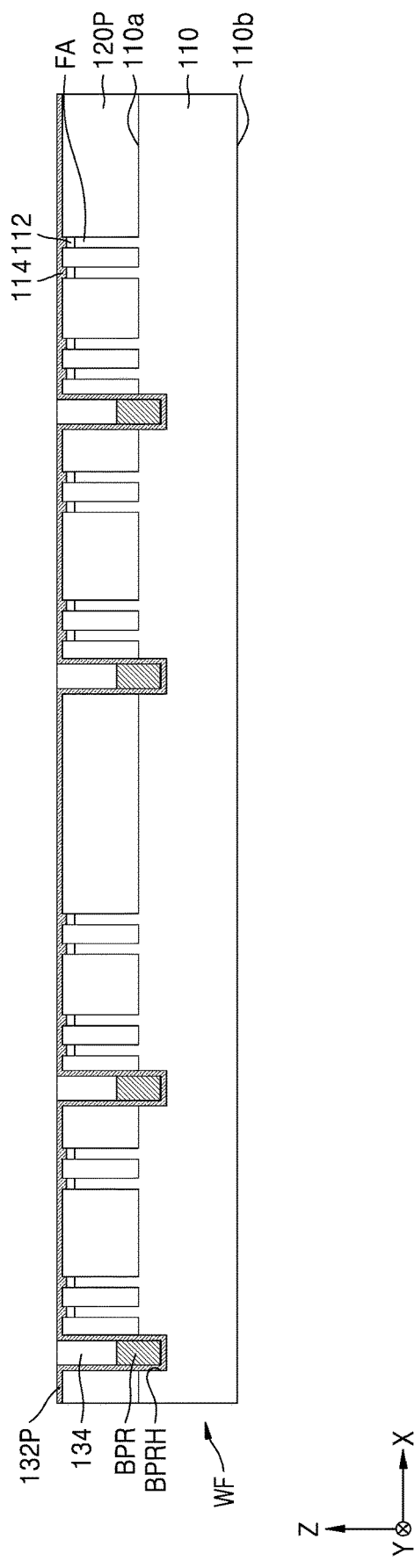

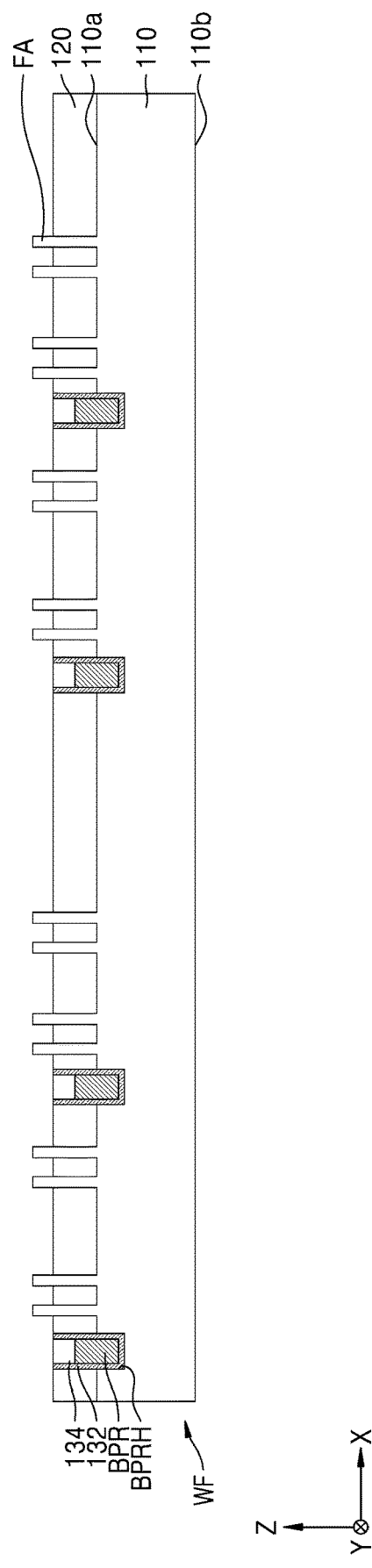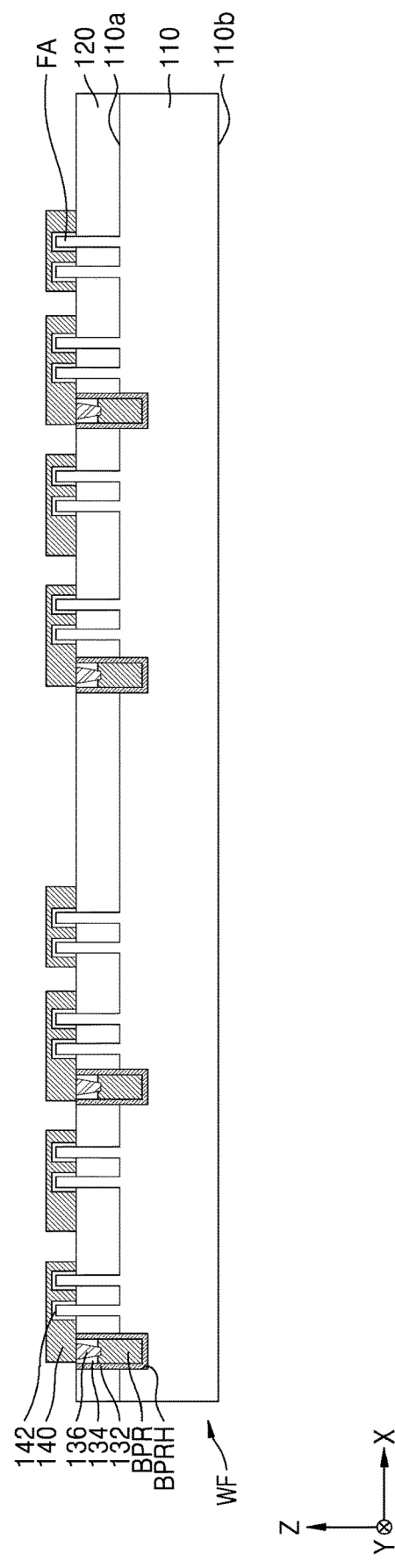

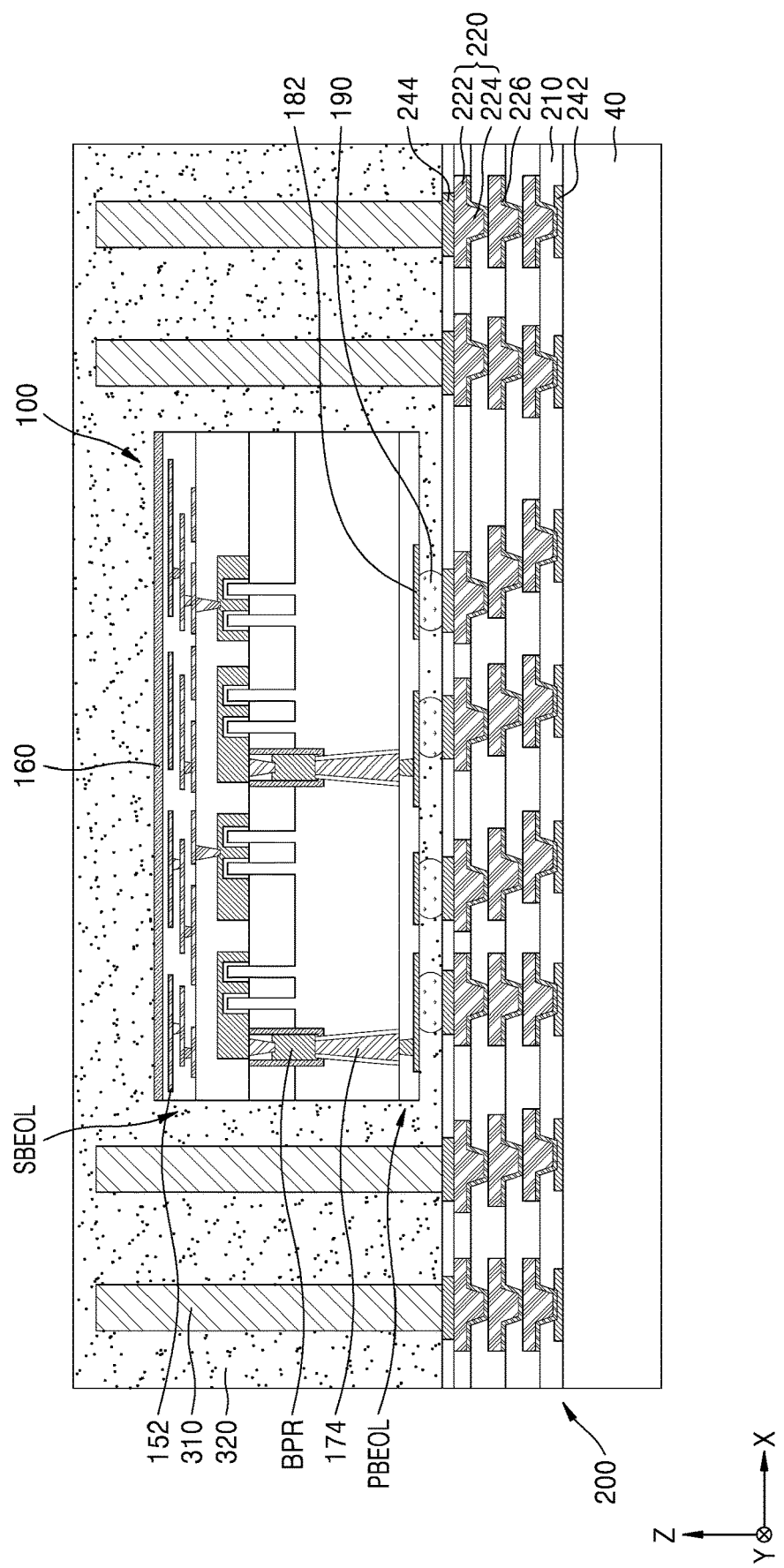

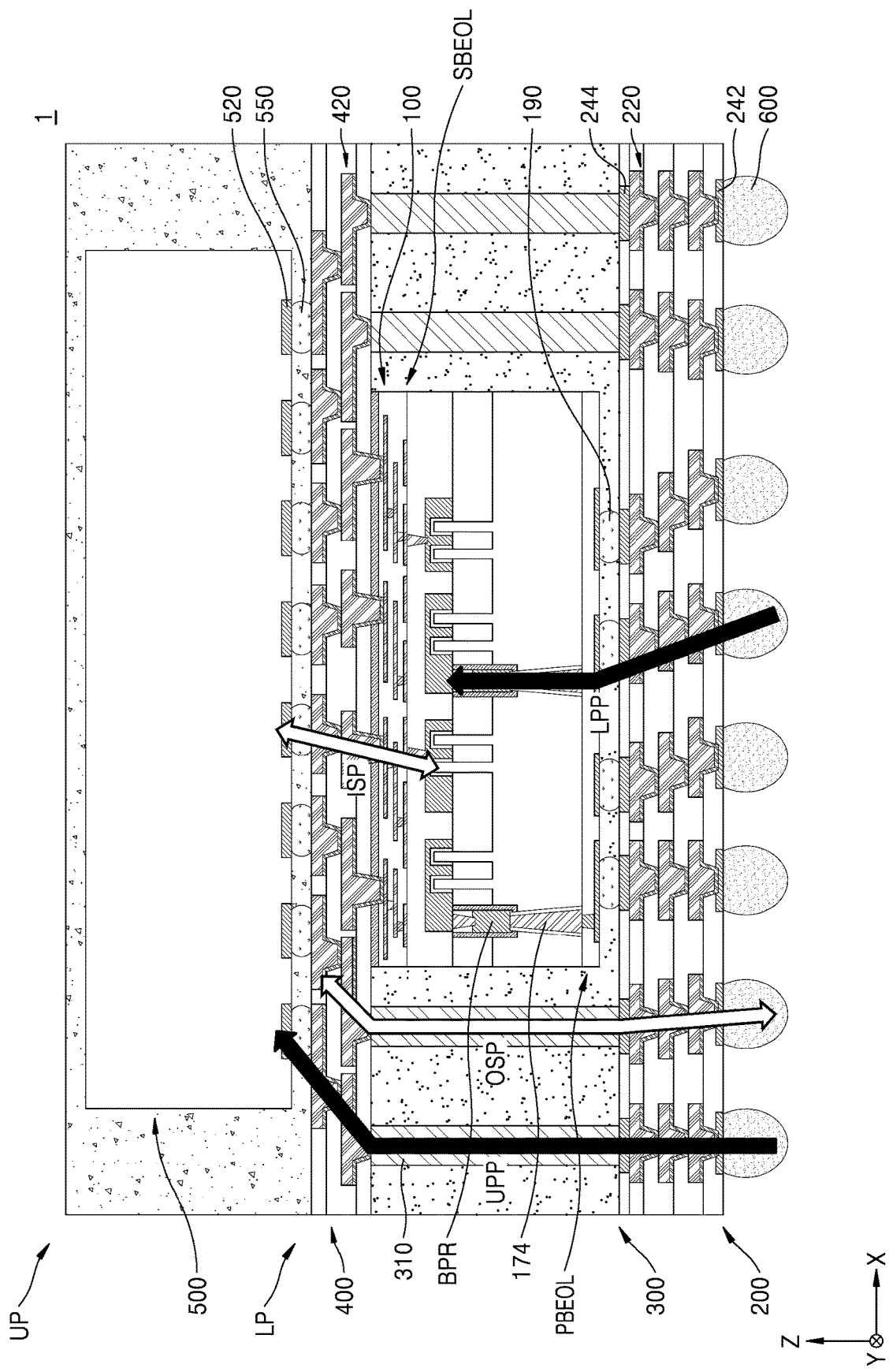

SEMICONDUCTOR PACKAGE INCLUDING A PLURALITY OF SEMICONDUCTOR CHIPS

CROSS-REFERENCE TO RELATED APPLICATION

This application is based claims priority under 35 U.S.C. § 119 to Korean Patent Application No. 10-2021-0055052, filed on Apr. 28, 2021, in the Korean Intellectual Property Office, the disclosure of which is incorporated by reference herein in its entirety.

TECHNICAL FIELD

The present disclosure relates to a semiconductor package, and more particularly, to a semiconductor package including a plurality of semiconductor chips.

DISCUSSION OF THE RELATED ART

As the electronics industry progresses, electronic devices are becoming smaller and lighter in weight. This is being accomplished, at least in part, by semiconductor devices being more highly integrated. In addition, as mobile products proliferate and develop, electronic devices have become both more miniaturized and multifunctional.

SUMMARY

A semiconductor package includes a lower redistribution layer having a lower redistribution conductive structure. A lower semiconductor chip and a plurality of conductive connection structures are attached to the lower redistribution layer. An upper redistribution layer has an upper redistribution conductive structure disposed on the lower semiconductor chip and the plurality of conductive connection structures. An upper semiconductor chip having an active plane corresponding to an active plane of the lower semiconductor chip is disposed on the upper redistribution layer. The upper semiconductor chip is electrically connected to the upper redistribution conductive structure. The lower semiconductor chip includes a semiconductor substrate having a first surface and a second surface opposite to each other. An upper wiring structure is disposed on the first surface of the semiconductor substrate and is electrically connected to the upper redistribution conductive structure. A buried power rail that fills a portion of a buried rail hole extends from the first surface of the semiconductor substrate toward the second surface thereof. A through electrode that fills a through hole extends from the second surface of the semiconductor substrate toward the first surface. The through electrode electrically connects the buried power rail to the lower redistribution conductive structure.

A semiconductor package includes a lower redistribution layer having a lower redistribution conductive structure. A lower semiconductor chip and a plurality of conductive connection structures are attached to the lower redistribution layer. An upper redistribution layer has an upper redistribution conductive structure disposed on the lower semiconductor chip and the plurality of conductive connection structures. An upper semiconductor chip is disposed on the upper redistribution layer and is electrically connected to the upper redistribution conductive structure. The lower semiconductor chip includes a semiconductor substrate having a first surface and a second surface opposite to each other. A buried power rail extends from the first surface of the semiconductor substrate toward the second surface. A through electrode extends from the second surface of the semiconductor substrate toward the first surface thereof and electrically connects the buried power rail to the lower redistribution conductive structure. The lower semiconductor chip is provided with power through a lower power path, the lower power path being generated through the lower redistribution conductive structure, the through electrode, and the buried power rail. The lower semiconductor chip and the upper semiconductor chip transmit and receive signals, other than power, to each other through an internal signal path generated along the upper redistribution conductive structure.

A semiconductor package includes a lower redistribution layer having a lower redistribution conductive structure. A plurality of external connection terminals is attached to a plurality of external connection pads disposed at a bottom of the lower redistribution layer. A lower semiconductor chip and a plurality of conductive connection structures are attached to the lower redistribution layer. A molding surrounds the lower semiconductor chip and the plurality of conductive connection structures on the lower redistribution layer. An upper redistribution layer includes an upper redistribution conductive structure disposed on the lower semiconductor chip, the plurality of conductive connection structures, and the molding, the upper redistribution layer having a thickness that is less than a thickness of the lower redistribution layer. An upper semiconductor chip has an active plane corresponding to an active plane of the lower semiconductor chip and is disposed on the upper redistribution layer, the upper semiconductor chip being electrically connected to the upper redistribution conductive structure. The lower semiconductor chip includes a semiconductor substrate having a first surface and a second surface opposite to each other, a plurality of fin-type active regions protruding upward from the first surface of the semiconductor substrate, a gate line extending in a direction crossing the plurality of fin-type active regions, an upper wiring structure disposed on the gate line and electrically connected to the upper redistribution conductive structure, a passivation layer covering the upper wiring structure, a lower wiring structure covering the second surface of the semiconductor substrate and electrically connected to the lower redistribution conductive structure, a buried power rail that fills a portion of a buried rail hole extending from the first surface of the semiconductor substrate toward the second surface, and a through electrode that extends from the second surface of the semiconductor substrate to the first surface and fills a through hole that communicates with the buried rail hole, the through electrode electrically connecting the buried power rail to the lower redistribution conductive structure.

BRIEF DESCRIPTION OF THE DRAWINGS

Embodiments of the inventive concept will be more clearly understood from the following detailed description taken in conjunction with the accompanying drawings in which:

FIGS. 2A to 2M are cross-sectional views illustrating a method of manufacturing a lower semiconductor chip of a semiconductor package according to example embodiments of the inventive concept;

FIGS. 3A to 3F are cross-sectional views illustrating a method of manufacturing a semiconductor package according to example embodiments of the inventive concept;

FIG. 9 is a cross-sectional view illustrating an operation of a semiconductor package according to example embodiments of the inventive concept.

DETAILED DESCRIPTION OF THE EMBODIMENTS

Figure 1:
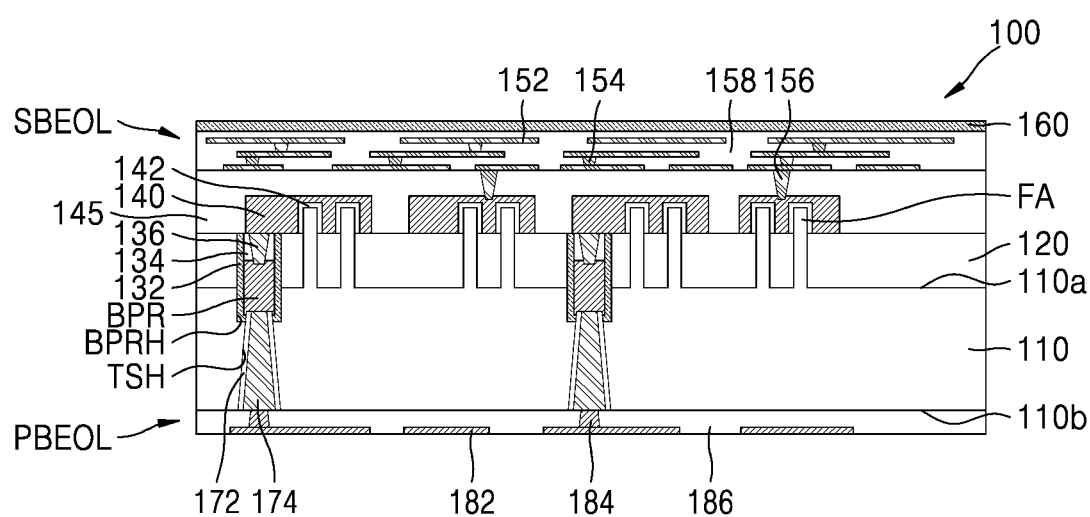
FIG. 1 is a cross-sectional view illustrating a lower semiconductor chip of a semiconductor package according to example embodiments of the inventive concept.

In describing embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

FIG. 1 is a cross-sectional view illustrating a lower semiconductor chip of a semiconductor package according to example embodiments of the inventive concept.

Referring to FIG. 1, a lower semiconductor chip 100 may include a first semiconductor substrate 110 having a first surface 110a and a second surface 110b opposite to the first surface 110a, and a plurality of fin-type active regions FA which protrude upwardly from the first surface 110a of the first semiconductor substrate 110. The first surface 110a of the first semiconductor substrate 110 may be referred to as a main surface of the first semiconductor substrate 110. The first surface 110a and the second surface 110b of the first semiconductor substrate 110 may extend in a first horizontal direction (an X direction) and a second horizontal direction (a Y direction).

The plurality of fin-type active regions FA may protrude upwardly from the main surface, for example, the first surface 110a of the first semiconductor substrate 110, in a vertical direction (a Z direction). The first semiconductor substrate 110 may include a semiconductor material such as Si or Ge, or a compound semiconductor material such as SiGe, SiC, GaAs, InAs, or InP. The first semiconductor substrate 110 may include a conductive region, for example, a well doped with impurities, or a structure doped with impurities. In some embodiments, the plurality of fin-type active regions FA may be arranged with a certain pitch in the first horizontal direction (the X direction) and may extend parallel to each other in the second horizontal direction (the Y direction).

A device isolation film 120 covering sidewalls of portions of lower ends of the plurality of fin-type active regions FA may be respectively formed between the plurality of fin-type active regions FA. The plurality of fin-type active regions FA may protrude upwardly from the device isolation film 120 in a fin shape. The device isolation film 120 may include, for example, an oxide, a nitride, or an oxynitride.

On the first semiconductor substrate 110, a plurality of gate lines 140 may extend in a direction crossing the plurality of fin-type active regions FA. In some embodiments, the plurality of gate lines 140 may extend in the first horizontal direction (the X direction). A gate insulating film 142 may be disposed between the gate line 140 and the fin-type active region FA. An interlayer insulating layer 145 may cover the device isolation film 120 and the plurality of gate lines 140.

The gate insulating film 142 may include a silicon oxide film, a high-k dielectric film, or a combination thereof. The high-k dielectric film may include a material with a greater dielectric constant than the silicon oxide film. The high-k dielectric film may include a metal oxide or a metal oxynitride. An interface film may be disposed between gate insulating film 142 and the fin-type active region FA. The interface film may include an oxide film, a nitride film, or an oxynitride film.

The gate line 140 may have a structure in which a metal nitride layer, a metal layer, a conductive capping layer, and a gap-fill metal film are sequentially stacked. The metal nitride layer and the metal layer may include Ti, Ta, W, Ru, Nb, Mo, and/or Hf. The gap-fill metal film may include a W film or an Al film. The gate lines 140 may respectively include a working function metal-containing layer. The working function metal-containing layer may include Ti, W, Ru, Nb, Mo, Hf, Ni, CO, Pt, Yb, Tb, Dy, Er, and/or Pd. In some embodiments, the gate lines 140 may respectively include a stacked structure of TiAlC/TiN/W, a stacked structure of TiN/TaN/TiAlC/TiN/W, or a stacked structure of TiN/TaN/TiN/TiAlC/TiN/W, but the present invention is not necessarily limited to thereto.

In some embodiments, the lower semiconductor chip 100 may be a logic semiconductor chip. For example, the lower semiconductor chip 100 may include a central processing unit (CPU) chip, a graphics processing unit (GPU) chip, or an application processor (AP) chip. The plurality of fin-type active regions FA and the plurality of gate lines 140 may constitute a first semiconductor device that functions as a CPU, a GPU, or an AP in an active plane of the first semiconductor substrate 110, or in the first surface 110a thereof.

Herein, the logic semiconductor chip is not a memory semiconductor chip and refers to a semiconductor chip for performing a logical operation. For example, the logic semiconductor chip may include a logic cell. The logic cell may be variously configured to include a plurality of circuit elements including a transistor, a register, and the like. The logic cell may constitute, for example, an AND, a NAND, an OR, a NOR, an exclusive OR (XOR), an exclusive NOR (XNOR), an inverter (INV), an adder (ADD), a buffer (BUF), a delay (DLY), a filter (FIL), a multiplexer (MXT/MXIT), an OAI (OR/AND/INVERTER), an AO (AND/OR), an AOI (AND/OR/INVERTER), a D flip flop, a reset flip flop, a master-slave flip-flop, a latch, and the like, and the logic cell may also constitute a standard cell that performs a desired logical function such as a counter, a buffer, and the like.

An upper wiring structure SBEOL may be disposed on the interlayer insulating layer 145. The upper wiring structure SBEOL may include a plurality of upper wiring lines 152, a plurality of upper wiring vias 154, a plurality of connection vias 156, and an upper interwire insulating layer 158 that at least partially surrounds the plurality of upper wiring lines 152 and the plurality of upper wiring vias 154. The plurality of upper wiring vias 154 may electrically connect the upper wiring lines 152, which are at different vertical levels among the plurality of upper wiring lines 152, to each other, for example, which are arranged in different wiring layers. The plurality of connection vias 156 may electrically connect the plurality of upper wiring lines 152 to the plurality of gate lines 140.

In some embodiments, some of the plurality of upper wiring lines 152 may function as a plurality of lower chip connection pads.

The plurality of upper wiring lines 152, the plurality of upper wiring vias 154, and the plurality of connection vias 156 may include a metal material such as copper (Cu), aluminum (Al), and tungsten (W). The upper interwire insulating layer 158 may include an insulating material such as a high density plasma (HDP) oxide film, a tetraethyorthosilicate (TEOS) oxide film, a tonen silazene (TOSZ) film, a spin on glass (SOG) film, and a undoped silica glass (USG) film, and a low-k dielectric layer.

A passivation layer 160 may cover the upper wiring structure SBEOL. The passivation layer 160 may be used as an etch stop film during manufacturing the semiconductor package including the lower semiconductor chip 100. The passivation layer 160 may include, for example, a silicon nitride.

FIG. 1 shows that top surfaces of the plurality of upper wiring lines 152 are entirely covered by the upper interwire insulating layer 158 and the passivation layer 160, but the present invention is not necessarily limited thereto. For example, portions of the upper interwire insulating layer 158 and the passivation layer 160 may be removed, and a portion of the top surfaces of some of the plurality of upper wiring lines 152 may be exposed.

A plurality of buried rail holes BPRH may penetrate the device isolation film 120 and extend into the first semiconductor substrate 110. The plurality of buried rail holes BPRH may be spaced apart from the plurality of fin-type active regions FA. The plurality of buried rail holes BPRH may extend between the plurality of gate lines 140 and a plurality of through electrodes 174. A plurality of buried power rails BPR may be disposed in the plurality of buried rail holes BPRH. A buried rail insulating layer 132 may be disposed between the buried power rail BPR and the first semiconductor substrate 110.

The buried rail insulating layer 132 may conformally cover an inner side surface of the buried rail hole BPRH. The buried rail insulating layer 132 may conformally cover the inner side surface of the buried rail hole BPRH together with a portion of a bottom surface of the buried rail hole BPRH. For example, the buried rail insulating layer 132 may extend from between the buried power rail BPR and the first semiconductor substrate 110 to between the buried power rail BPR and the device isolation film 120. A top end of the buried rail insulating layer 132 may contact a lower surface of the gate line 140, or contact both the lower surface of the gate line 140 and a lower surface of the interlayer insulating layer 145. The buried rail insulating layer 132 may include a nitride. For example, the buried rail insulating layer 132 may include a silicon nitride.

The buried power rail BPR may include a conductive material such as a metal. The buried power rail BPR may include a rail barrier film that covers at least portions of an inner side surface and a bottom surface of the buried rail hole BPRH, and a rail filling layer that covers the rail barrier film and fills at least a portion of the buried rail hole BPRH. For example, the rail barrier film may include TiN, and the rail filling layer may include W or Ru.

In some embodiments, the buried power rail BPR may fill only a lower portion of the buried rail hole BPRH, and the buried insulating layer 134 may fill an upper portion of the buried rail hole BPRH. The buried rail insulating layer 132 may extend from between the buried power rail BPR and the first semiconductor substrate 110, through between the buried power rail BPR and the device isolation film 120, to between the buried insulating layer 134 and the device isolation film 120. The buried insulating layer 134 may include a silicon oxide, a silicon nitride, or a combination thereof.

A power via 136 penetrating the buried insulating layer 134 may be disposed between the buried power rail BPR and the gate line 140, thereby electrically connecting the buried power rail BPR to the gate line 140. In some embodiments, after forming a power via hole that penetrates the buried insulating layer 134 and exposes the buried power rail BPR at a bottom surface thereof, and then filling the power via hole with a conductive material for forming the plurality of gate lines 140, the power via 136 may then be formed integrally with any one of the plurality of gate lines 140.

A through hole TSH may extend into the first semiconductor substrate 110 from the second surface 110b of the first semiconductor substrate 110. The through hole TSH may communicate with the buried rail hole BPRH. In some embodiments, the through hole TSH may have a tapered shape in which a horizontal width thereof decreases as the through hole TSH extends from the second surface 110b of the first semiconductor substrate 110 into the first semiconductor substrate 110, for example, the horizontal width increases as the through hole TSH extends toward the second surface 110b of the first semiconductor substrate 110.

The through hole TSH may be filled by the through electrode 174 and a via insulating film 172 between the first semiconductor substrate 110 and the through electrode 174.

The via insulating film 172 may include an oxide film, a nitride film, a carbide film, a polymer film, or combinations thereof. In some embodiments, the via insulating film 172 may be formed using a CVD process. The via insulating film 172 may include a high aspect ratio process (HARP) oxide based on an ozone/tetra-ethyl ortho-silicate ($O_3$/TEOS) formed by a sub-atmospheric CVD process.

The through hole TSH may have a tapered shape in which the horizontal width thereof decreases from the second surface 110b of the first semiconductor substrate 110 to the buried power rail BPR. The through electrode 174 may include a conductive plug that contacts the buried power rail BPR and extends to the second surface 110b of the first semiconductor substrate 110, and a conductive barrier film that at least partially surrounds the conductive plug. The conductive plug may include Cu or W. For example, the conductive plug may include Cu, CuSn, CuMg, CuNi, CuZn, CuPd, CuAu, CuRe, CuW, W, or W alloy, but the present invention is not necessarily limited thereto. For example, the conductive plug may include one or more of Al, Au, Be, Bi, Co, Cu, Hf, In, Mn, Mo, Ni, Pb, Pd, Pt, Rh, Re, Ru, Ta, Te, Ti, W, Zn, Zr, or may include a stacked structure of two or more of those described in the above. The conductive barrier film may include W, WN, WC, Ti, TiN, Ta, TaN, Ru, Ru, Co, Mn, WN, Ni, and/or NiB, in a single layer or multiple layers, but the present invention is not necessarily limited thereto. The conductive plug and the conductive barrier film may be formed by a physical vapor deposition (PVD) process or a chemical vapor deposition (CVD) process, but the present invention is not necessarily limited thereto.

A lower wiring structure PBEOL may be disposed on the second surface 110b of the first semiconductor substrate 110. The lower wiring structure PBEOL may include a plurality of lower wiring lines 182, a plurality of lower wiring vias 184, and a lower interwire insulating layer 186 at least partially surrounding the plurality of lower wiring lines 182 and the lower wiring vias 184. The plurality of lower wiring vias 184 may electrically connect the plurality of lower wiring lines 182 to the plurality of through electrodes 174. In some embodiments, when the plurality of lower wiring lines 182 have two or more wiring layers, some of the plurality of lower wiring vias 184 may electrically connect the plurality of lower wiring lines 182 located at different vertical levels, for example, the lower wiring lines 182 may be arranged in different wiring layers from each other.

The wiring layer refers to an electrical path extending on a plane at the same vertical level. The upper wiring structure SBEOL may have more wiring layers than the lower wiring structure PBEOL. For example, the upper wiring structure SBEOL may have at least two wiring layers, and the lower wiring structure PBEOL may have at least one wiring layer. A thickness of the upper wiring structure SBEOL in the vertical direction (the Z direction) may be greater than the thickness of the lower wiring structure PBEOL.

The lower semiconductor chip 100 may transmit and receive signals such as a data signal and a control signal, except for power, to and from an external source through the upper wiring structure SBEOL, and may be provided with external power through the lower wiring structure PBEOL. Therefore, the upper wiring structure SBEOL may be referred to as a signal wiring structure, and the lower wiring structure PBEOL may be referred to as a power wiring structure. In some embodiments, the lower semiconductor chip 100 may be provided with power and ground together from an external source through the lower wiring structure PBEOL.

The lower semiconductor chip 100, according to examples of the present inventive concept, may transmit and receive signals such as a data signal and a control signal, except for power, through the upper wiring structure SBEOL disposed on the first surface 110a of the first semiconductor substrate 110, and may be provided with the external power through the lower wiring structure PBEOL disposed on the second surface 110b of the first semiconductor substrate 110. Therefore, in the lower semiconductor chip 100, the signal and power may be separately provided through an upper portion and a lower portion, respectively, and thus the interference between the signal and power may be minimized. In addition, even when the degree of integration of the lower semiconductor chip 100 increases, such as when widths of the plurality of fin-type active regions FA are reduced, the signal and power may be stably provided to the lower semiconductor chip 100.

FIGS. 2A to 2M are cross-sectional views illustrating a method of manufacturing a lower semiconductor chip of a semiconductor package according to example embodiments of the inventive concept.

Referring to FIG. 2A, after forming a buffer layer 112 and a plurality of hard mask patterns 114 on the first semiconductor substrate 110, portions of the first semiconductor substrate 110 may be removed using the plurality of hard mask patterns 114 to form the plurality of fin-type active regions FA. In a process of forming the plurality of fin-type active regions FA, the buffer layer 112 may be also patterned and separated into a plurality.

The first semiconductor substrate 110 may be a wafer substrate WF via which a plurality of lower semiconductor chips may be created. The plurality of fin-type active regions FA may protrude upwardly from the first surface 110a of the first semiconductor substrate 110.

For example, the buffer layer 112 may include an oxide, a nitride, or an oxynitride. In some embodiments, the plurality of hard mask patterns 114 may be formed using a pattern density increasing technique using a spacer, such as double patterning technique (DPT) or quadruple patterning technique (QPT). The plurality of hard mask patterns 114 may include a stacked structure having at least two layers which include different insulating materials including an oxide, a nitride, an oxynitride, a polysilicon, and/or a carbon-containing film. The carbon-containing film may include a spin-on hard mask (SOH) material. The SOH material may include a hydrocarbon compound or a derivative thereof, wherein the SOH material has a relatively high carbon content of from about 85% to about 99% by weight based on the total weight of the SOH material.

Referring to FIG. 2B, a preliminary device isolation layer 120P may fill a space between the plurality of fin-type active regions FA. The preliminary device isolation layer 120P may cover, for example, side walls of the plurality of fin-type active regions FA, a plurality of patterned buffer layers 112, and the plurality of hard mask patterns 114. In some embodiments, the preliminary device isolation layer 120P may cover upper surfaces of the plurality of hard mask patterns 114 and then portions of the preliminary device isolation layer 120P on top surfaces of the plurality of hard mask patterns 114 may be removed, thereby exposing the top surfaces of the plurality of hard mask patterns 114.

Referring to FIG. 2C, the plurality of buried rail holes BPRH may extend into the first semiconductor substrate 110 through the preliminary device isolation layer 120P. The plurality of buried rail hole BPRH may penetrate the preliminary device isolation layer 120P and extend from the first surface 110a of the first semiconductor substrate 110 toward the second surface 110b thereof, but not to the second surface 110b thereof. The plurality of buried rail holes BPRH may be spaced apart from the plurality of fin-type active regions FA.

Referring to FIG. 2D, a cover insulating layer 132P that covers an inner surface of the plurality of buried rail holes BPRH, e.g., a side surface and a bottom surface thereof, and a top surface of the preliminary device isolation layer 120P, may be formed. The cover insulating layer 132P may conformally cover the side surface and the bottom surface of the plurality of buried rail holes BPRH and the top surface of the preliminary device isolation layer 120P. For example, the cover insulating layer 132P may have a thickness of about 5 nm to about 9 nm. The cover insulating layer 132P may include a nitride.

After forming a rail material layer covering the cover insulating layer 132P and filling the plurality of buried rail holes BPRH, by removing a portion of an upper part of the rail material layer in the plurality of buried rail holes BPRH, the plurality of buried power rails BPR that fill a portion of a lower part of the plurality of buried rail holes BPRH may be formed.

The buried power rail BPR may include a conductive material such as a metal. The buried power rail BPR may include a rail barrier film that covers a portion of a lower part of an inner side surface and a bottom surface of the buried rail hole BPRH, and a rail filling layer that covers the rail barrier film and fills a portion of the lower part of the buried rail hole BPRH. For example, the rail barrier film may include TiN, and the rail filling layer may include W or Ru. In some embodiments, the rail barrier film may have a thickness that is less than that of the cover insulating layer. For example, the rail barrier film may have a thickness of about 2 nm to about 6 nm.

After forming the buried power rail BPR, the buried insulating layer 134 filling the upper part of the buried rail hole BPRH may be formed. The buried insulating layer 134 may include a silicon oxide, a silicon nitride, or a combination thereof.

Referring to FIGS. 2D and 2E together, portions of the cover insulating layer 132P and the preliminary device isolation layer 120P may form the buried rail insulating layer 132 and the device isolation film 120. The plurality of fin-type active regions FA may protrude upwardly from the device isolation film 120 in a fin shape.

For example, a portion of the cover insulating layer 132P covering a top surface of the preliminary device isolation layer 120P, a portion of the upper part of the preliminary device isolation layer 120P, and a portion of the cover insulating layer 132P that covers a side surface of the upper part of the preliminary device isolation layer 120P, for example, covers the upper part of the side surface of the buried rail hole BPRH may be removed to form the buried rail insulating layer 132 and the device isolation film 120. In the process of forming the buried rail insulating layer 132 and the device isolation film 120, a portion of the upper part of the buried insulating layer 134 filling the upper portion of the plurality of buried rail holes BPRH may be removed together.

Referring to FIG. 2F, the plurality of gate lines 140 extending in the X direction while crossing the plurality of fin-type active regions FA, and a plurality of gate insulating films 142 between the plurality of fin-type active regions FA and the plurality of gate lines 140 may be formed.

In some embodiments, the plurality of gate insulating films 142 and the plurality of gate lines 140 may be formed using a replacement gate process, wherein a plurality of dummy gate insulating films and a plurality of dummy gate lines are first formed, the plurality of dummy gate insulating films and the plurality of dummy gate lines may be removed after some subsequent processes have been performed, and then the plurality of gate insulating films 142 and the plurality of gate lines 140 may be formed.

The power via 136 that penetrates the buried insulating layer 134 may be formed between the buried power rail BPR and the gate line 140.

In some embodiments, after forming the power via hole that penetrates the buried insulating layer 134 and exposes the buried power rail BPR at the bottom surface thereof, and then filling the power via hole with the conductive material for forming the plurality of gate lines 140, the power via 136 may then be formed integrally with any one of the plurality of gate lines 140.

In some embodiments, the power via 136 may be formed by filling the conductive material in the power via hole, and then the gate line 140 that contacts the power via 136 may be formed separately.

Figure 2G:
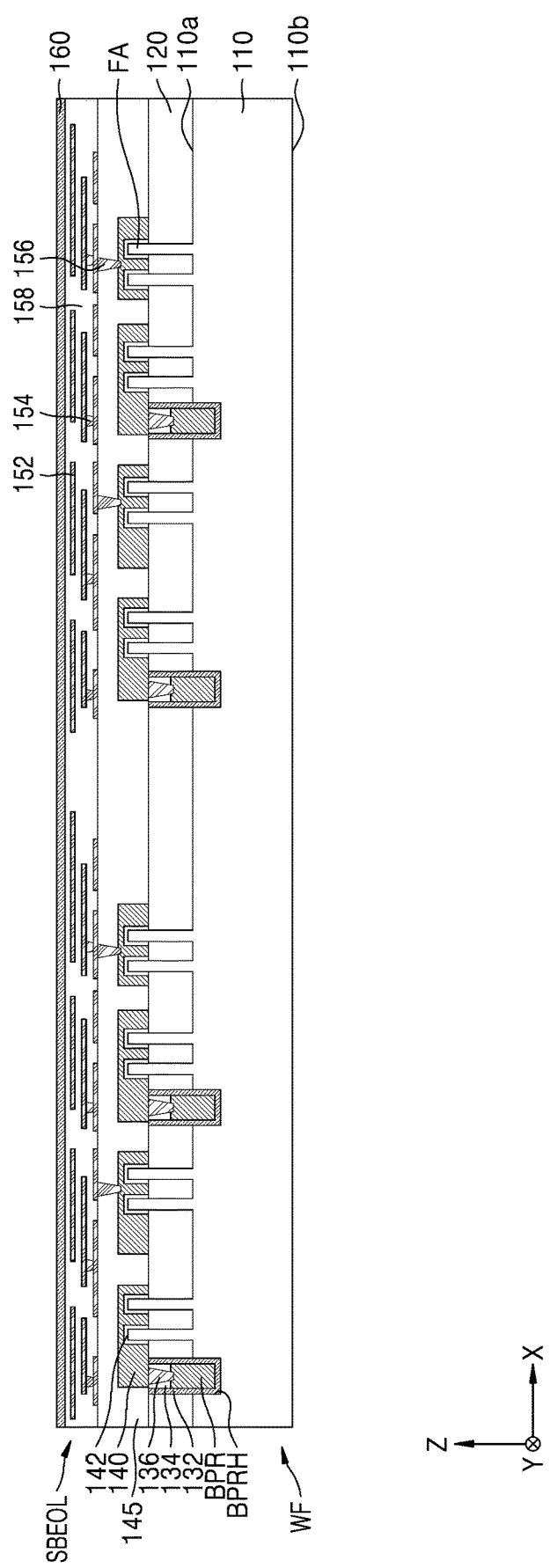

Referring to FIG. 2G, the interlayer insulating layer 145 covering the device isolation film 120 and the plurality of gate lines 140 may be formed, and then the upper wiring structure SBEOL may be formed on the interlayer insulating layer 145. The upper wiring structure SBEOL may include the plurality of upper wiring lines 152, the plurality of upper wiring vias 154, the plurality of connection vias 156, and the upper interwire insulating layer 158 that at least partially surrounds the plurality of upper wiring lines 152 and the plurality of upper wiring vias 154. The plurality of upper wiring vias 154 may penetrate at least a portion of the upper interwire insulating layer 158 and may connect the upper wiring lines 152 disposed on different wiring layers to each other. The plurality of connection vias 156 may connect the plurality of upper wiring lines 152 to the plurality of gate lines 140. In some embodiments, the plurality of connection vias 156 may penetrate the interlayer insulating layer 145 and connect the plurality of upper wiring lines 152 to the plurality of gate lines 140. In some embodiments, the plurality of connection vias 156 may penetrate a portion of a lower part of the upper interwire insulating layer 158 and the interlayer insulating layer 145 and connect the plurality of upper wiring lines 152 to the plurality of gate lines 140.

The passivation layer 160 may cover the upper wiring structure SBEOL. The passivation layer 160 may include a material having etching properties different from that of the upper interwire insulating layer 158. For example, the upper interwire insulating layer 158 may include a silicon oxide, and the passivation layer 160 may include a silicon nitride.

Figure 2H:
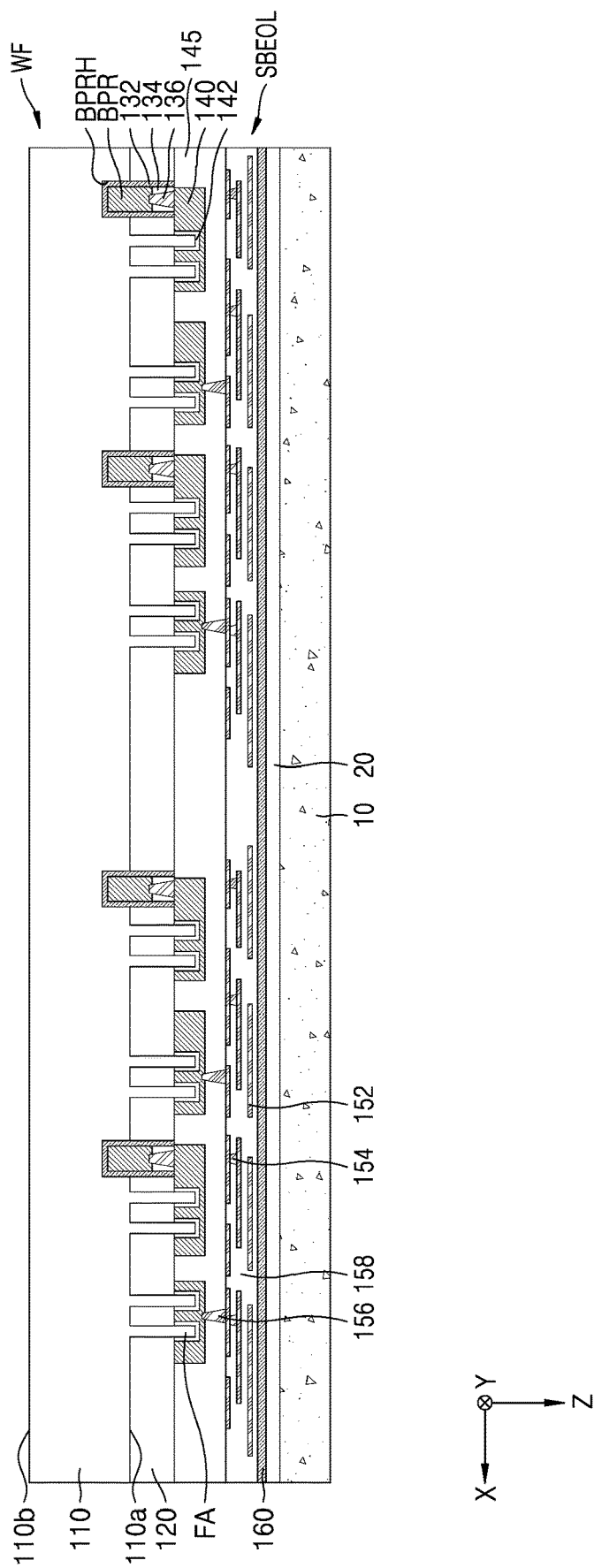

Referring to FIG. 2H, a resulting structure of FIG. 2G may be inverted so that the passivation layer 160 faces a first support substrate 10, and then the passivation layer 160 may be attached to the first support substrate 10. A release film 20 may be disposed between the first support substrate 10 and the passivation layer 160.

Figure 2I:
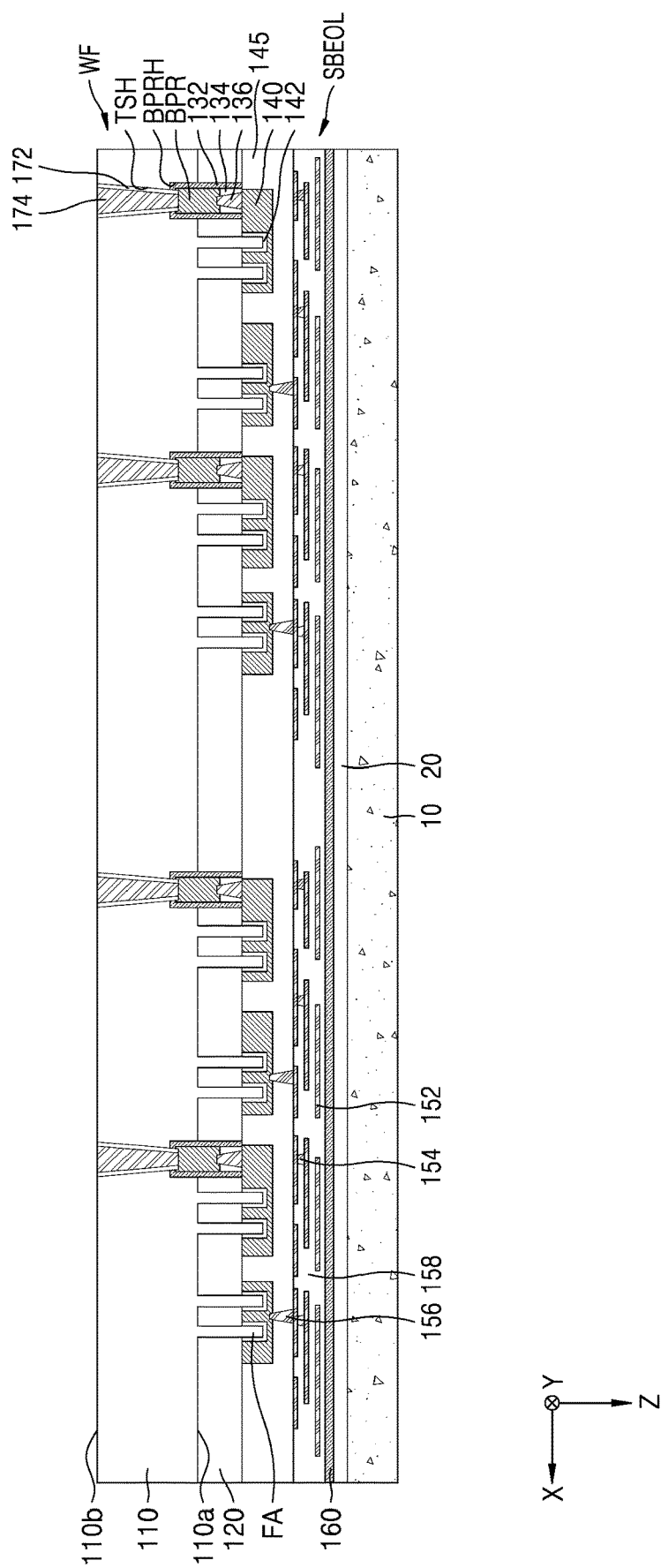

Referring to FIG. 2I, the plurality of through holes TSH extending from the second surface 110b of the first semiconductor substrate 110 into the first semiconductor substrate 110 may be formed. The plurality of through holes TSH may extend from the second surface 110b of the first semiconductor substrate 110 to the plurality of buried power rails BPR. In some embodiments, the through holes TSH may have a tapered shape in which the horizontal width of the through holes TSH decreases as the through holes TSH extend from the second surface 110b of the first semiconductor substrate 110 into the first semiconductor substrate 110.

The plurality of via insulating films 172 covering a side surface of the plurality of through holes TSH, and the plurality of through electrodes 174 that cover the plurality of via insulating films 172 and fill the plurality of through holes TSH may be formed. The plurality of via insulating films 172 may conformally cover the side surface of the plurality of through holes TSH. The plurality of through electrodes 174 may contact the plurality of buried power rails BPR.

Figure 2J:
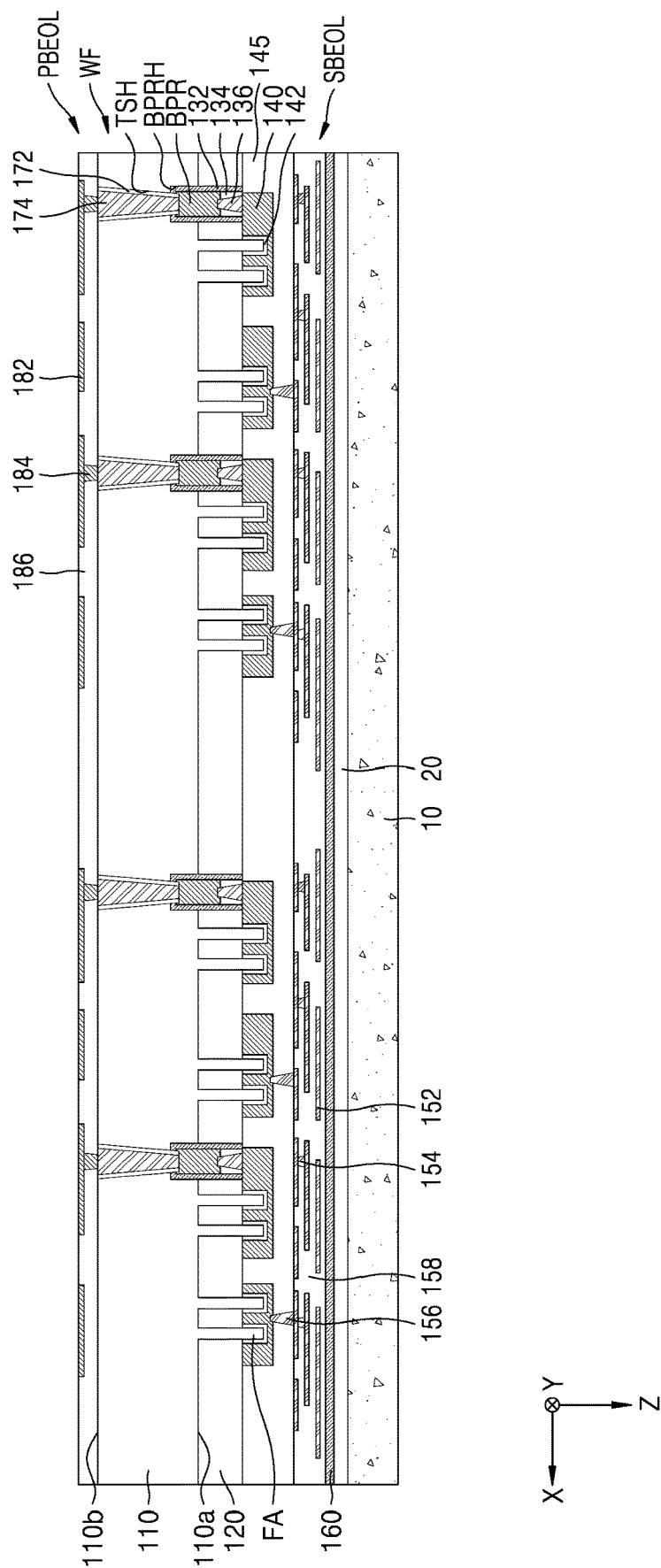

Referring to FIG. 2J, the lower wiring structure PBEOL may be formed on the second surface 110b of the first semiconductor substrate 110. The lower wiring structure PBEOL may include the plurality of lower wiring lines 182, the plurality of lower wiring vias 184, and the lower interwire insulating layer 186 at least partially surrounding the plurality of lower wiring lines 182 and the lower wiring vias 184. The plurality of lower wiring vias 184 may penetrate the lower interwire insulating layer 186 and may connect the plurality of lower wiring lines 182 to the plurality of through electrodes 174.

Figure 2K:
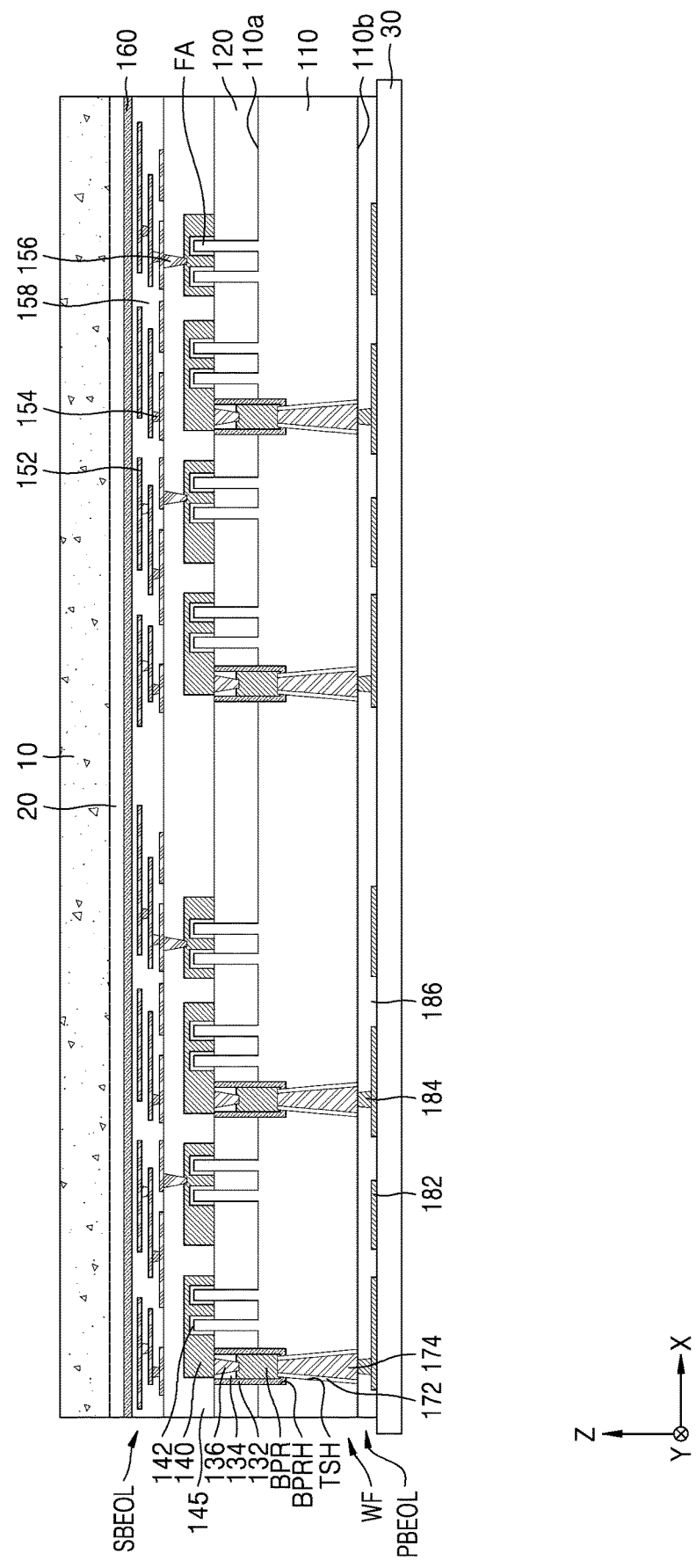

Referring to FIG. 2K, a resulting structure of FIG. 2J may be inverted so that the lower wiring structure PBEOL faces a dicing film 30, and then the lower wiring structure PBEOL may be attached to the dicing film 30.

Figure 2L:
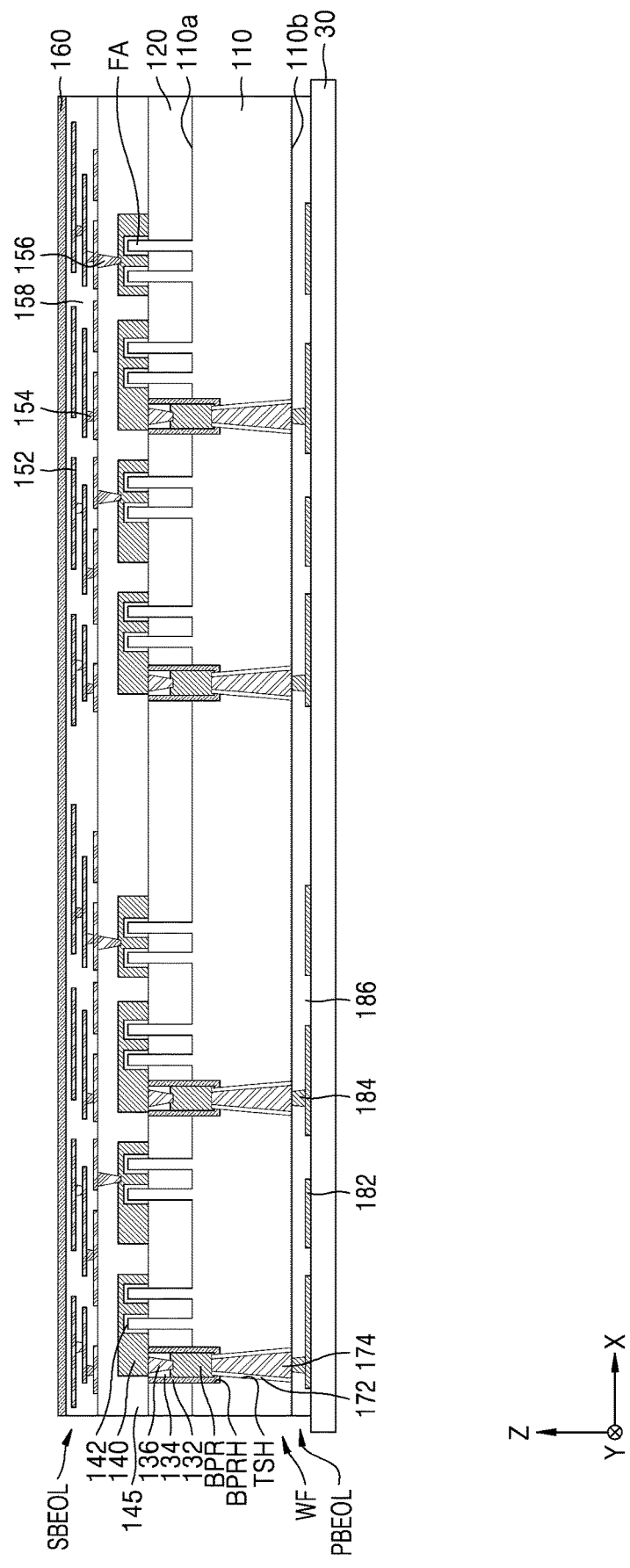

Referring to FIGS. 2K and 2L together, the first support substrate 10 attached with the release film 20 may be removed from the passivation layer 160.

Figure 2M:
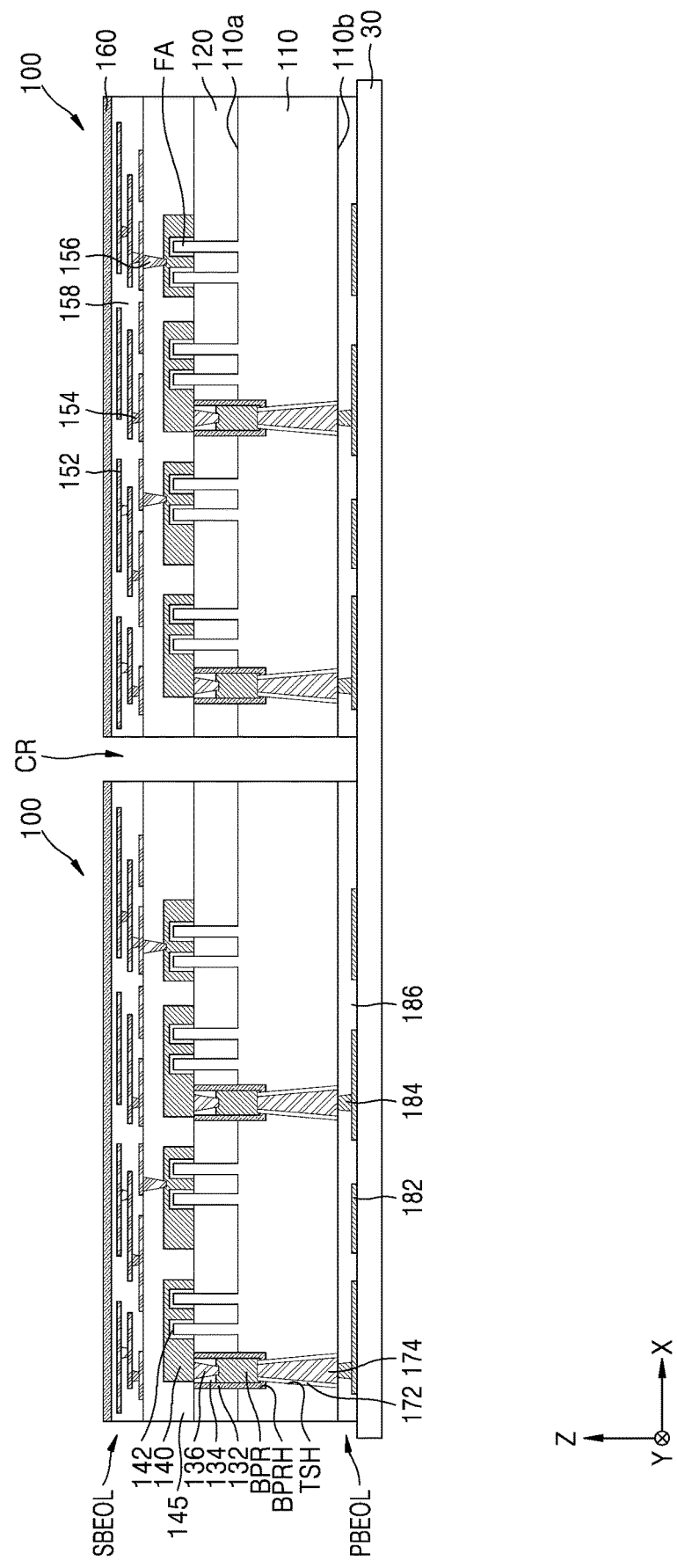

Referring to FIG. 2M, a plurality of lower semiconductor chips 100 may be formed by cutting the resulting structure of FIG. 2L. A cut region CR may be formed between the plurality of lower semiconductor chips 100. The cut region CR may be formed using blade dicing, plasma dicing, or laser dicing. The individual lower semiconductor chip 100 may be separated from the dicing film 30.

FIGS. 3A to 3F are cross-sectional views illustrating a method of manufacturing a semiconductor package according to example embodiments of the inventive concept.

Figure 3A:
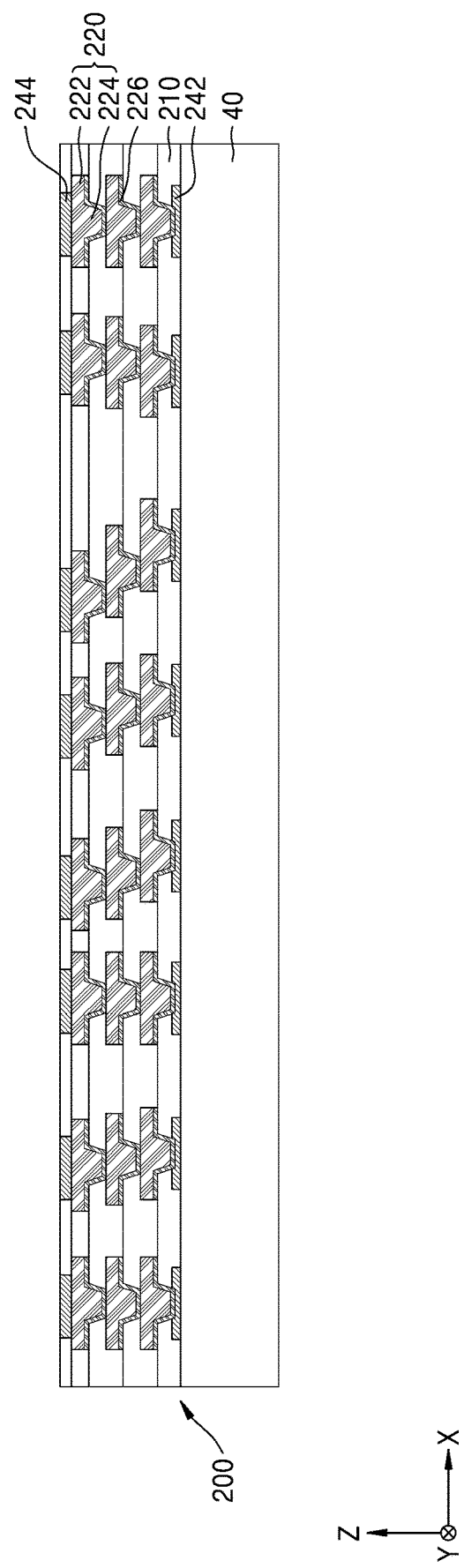

Referring to FIG. 3A, a lower redistribution layer 200 may be formed on a second support substrate 40. The lower redistribution layer 200 may include a plurality of lower redistribution insulating layers 210 and a lower redistribution conductive structure 220. The lower redistribution conductive structure 220 may include a plurality of lower redistribution line patterns 222 and a plurality of lower redistribution vias 224, wherein the plurality of lower redistribution line patterns 222 may be disposed on at least one surface of a top surface and a bottom surface of each of the plurality of lower redistribution insulating layers 210, and the plurality of lower redistribution vias 224 may penetrate at least one lower redistribution insulating layer among the plurality of lower redistribution insulating layers 210 to respectively contact and connect to some of the plurality of lower redistribution line patterns 222.

Each of the plurality of lower redistribution insulating layers 210 may include a material film including, for example, an organic compound. In some embodiments, the plurality of lower redistribution insulating layers 210 may include a material film including an organic polymer material. For example, each of the plurality of lower redistribution insulating layers 210 may include photo imageable dielectric (PID), an Ajinomoto build-up film (ABF), or photosensitive polyimide (PSPI).

The plurality of lower redistribution line patterns 222 and the plurality of lower redistribution vias 224 may include a metal or alloys thereof. In some embodiments, the plurality of lower redistribution vias 224 may have a tapered shape in which the horizontal width thereof decreases from a top side to a bottom side thereof. At least some of the plurality of lower redistribution line patterns 222 may be integrally formed together with some of the plurality of lower redistribution vias 224. In some embodiments, some of the plurality of lower redistribution line patterns 222 may be integrally formed together with some of the plurality of lower redistribution vias 224 that contact lower sides of some of the plurality of lower redistribution line patterns 222. In some embodiments, some of the plurality of lower redistribution line patterns 222 may be integrally formed together with some of the plurality of lower redistribution vias 224 that contact upper sides of some of the plurality of lower redistribution line patterns 222.

A lower redistribution seed layer 226 may be disposed between the plurality of lower redistribution line patterns 222 and the plurality of lower redistribution insulating layers 210 and between the plurality of lower redistribution vias 224 and the plurality of redistribution insulating layers 210. In some embodiments, the lower redistribution seed layer 226 may be disposed between each bottom surface of the plurality of lower redistribution line patterns 222 and the plurality of lower redistribution vias 224 and any one of the plurality of lower redistribution insulating layers 210, and between side surfaces of the plurality of lower redistribution vias 224 and any one of the plurality of lower redistribution insulating layers 210.

For example, the lower redistribution seed layer 226 may be formed by performing PVD, and the plurality of lower redistribution line patterns 222 and the plurality of lower redistribution vias 224 may be formed by performing electrolytic plating or electroless plating using the lower redistribution seed layer 226 as a seed. The lower redistribution seed layer 226 may be, for example, copper (Cu), titanium (Ti), titanium tungsten (TiW), titanium nitride (TiN), tantalum (Ta), tantalum nitride (TaN), chromium (Cr), and/or aluminum (Al), and the like.

In some embodiments, the lower redistribution layer 200 may further include a plurality of external connection pads 242 disposed at a lower portion of the lower redistribution layer 200. For example, the plurality of external connection pads 242 may be first formed on the second support substrate 40, and then the plurality of lower redistribution insulating layers 210 and the lower redistribution conductive structure 220 may be formed. The plurality of external connection pads 242 may be electrically connected to the lower redistribution conductive structure 220.

In some embodiments, the lower redistribution layer 200 might not include the plurality of external connection pads 242, and portions of the plurality of lower redistribution line patterns 222 and the plurality of lower redistribution vias 224 may function as the plurality of external connection pads.

In some embodiments, the lower redistribution layer 200 may further include a plurality of lower connection pads 244 disposed at an upper portion of the lower redistribution layer 200. In some embodiments, the plurality of external connection pads 242 and the plurality of lower connection pads 244 may include the same or similar material to the lower redistribution line pattern 222. For example, the plurality of lower connection pads 244 electrically connected to the lower redistribution conductive structure 220 may be formed on the plurality of lower redistribution insulating layers 210 and the lower redistribution conductive structure 220.

In some embodiments, the lower redistribution layer 200 might not include the plurality of lower connection pads 244, and portions of the plurality of lower redistribution line patterns 222 may function as the plurality of lower connection pads.

Figure 3B:
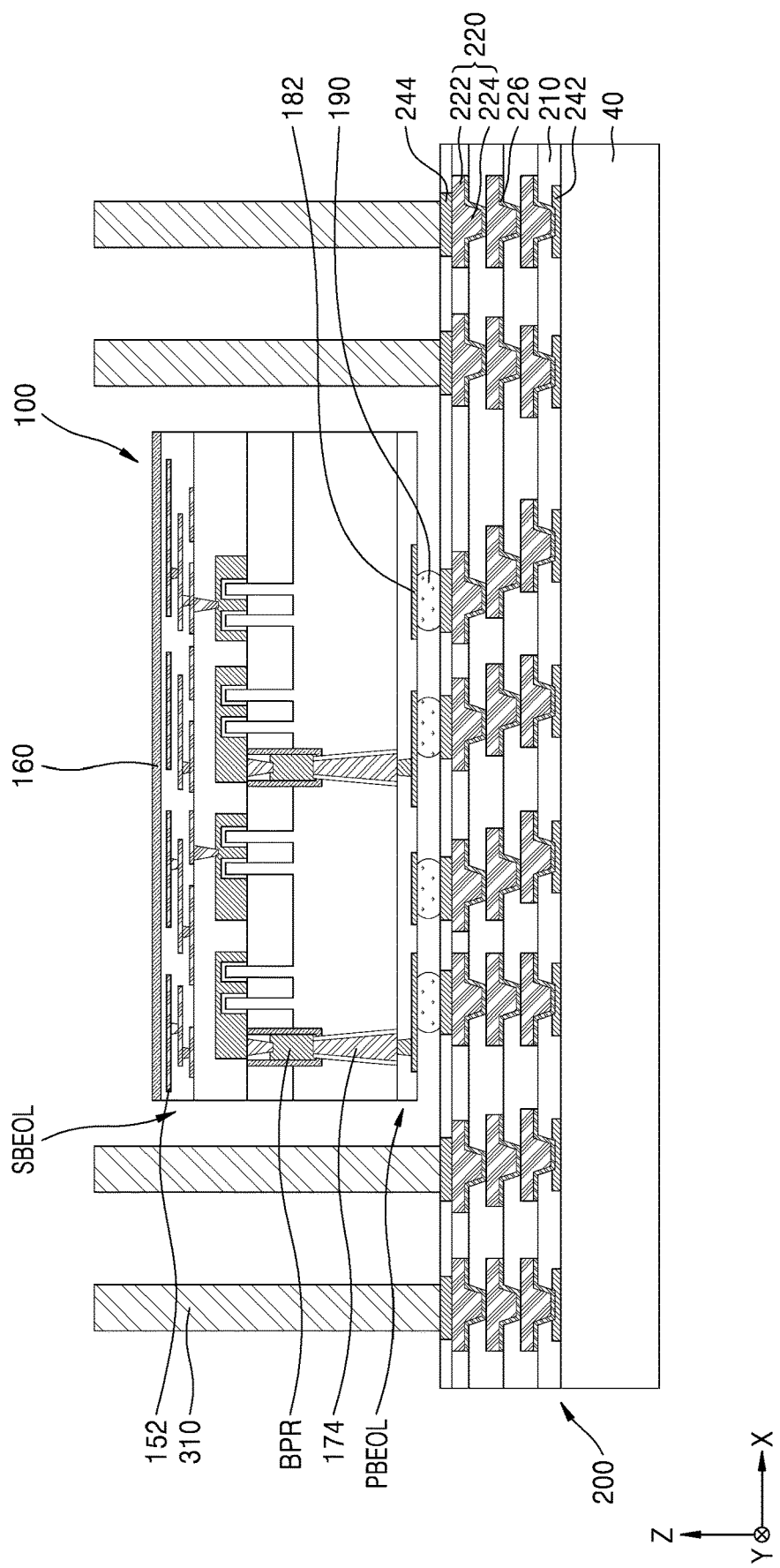

Referring to FIG. 3B, a plurality of conductive connection structures 310 and the lower semiconductor chip 100 may be attached to the lower redistribution layer 200. The plurality of conductive connection structures 310 may be attached to some of the plurality of lower connection pads 244. The lower semiconductor chip 100 may be attached to some other of the plurality of lower connection pads 244. A top surface of the plurality of conductive connection structures 310 may be at a higher vertical level than a top surface of the lower semiconductor chip 100, for example, a top surface of the passivation layer 160.

In some embodiments, the plurality of conductive connection structures 310 may be directly attached to some of the plurality of lower connection pads 244. For example, each of the plurality of conductive connection structures 310 may include a through mold via (TMV), a conductive solder, a conductive pillar, or at least one conductive bump. In some embodiments, each of the plurality of conductive connection structures 310 may include a copper post.

A plurality of first chip connection terminals 190 may be disposed between the lower semiconductor chip 100 and the plurality of lower connection pads 244. The plurality of first chip connection terminals 190 may connect some of the plurality of lower wiring lines 182 of the lower semiconductor chip 100 to the plurality of lower connection pads 244. For example, the plurality of first chip connection terminals 190 may include a bump or a solder ball.

Referring to FIG. 3C, a first molding 320 covering the plurality of conductive connection structures 310 and the lower semiconductor chip 100 may be formed on the lower redistribution layer 200. The first molding 320 may include, for example, an epoxy mold compound (EMC). In some embodiments, the first molding 320 may fill a space between the lower redistribution layer 200 and the lower semiconductor chip 100, and may wrap the plurality of first chip connection terminals 190.

In some embodiments, an underfill layer that wraps the plurality of first chip connection terminals 190 between the lower redistribution layer 200 and the lower semiconductor chip 100 may be first formed, and then a first molding 320 may be formed. The underfill layer may include, for example, an epoxy resin formed by a capillary under-fill method. Alternatively, the underfill layer may include a nonconductive film (NCF).

Figure 3D:
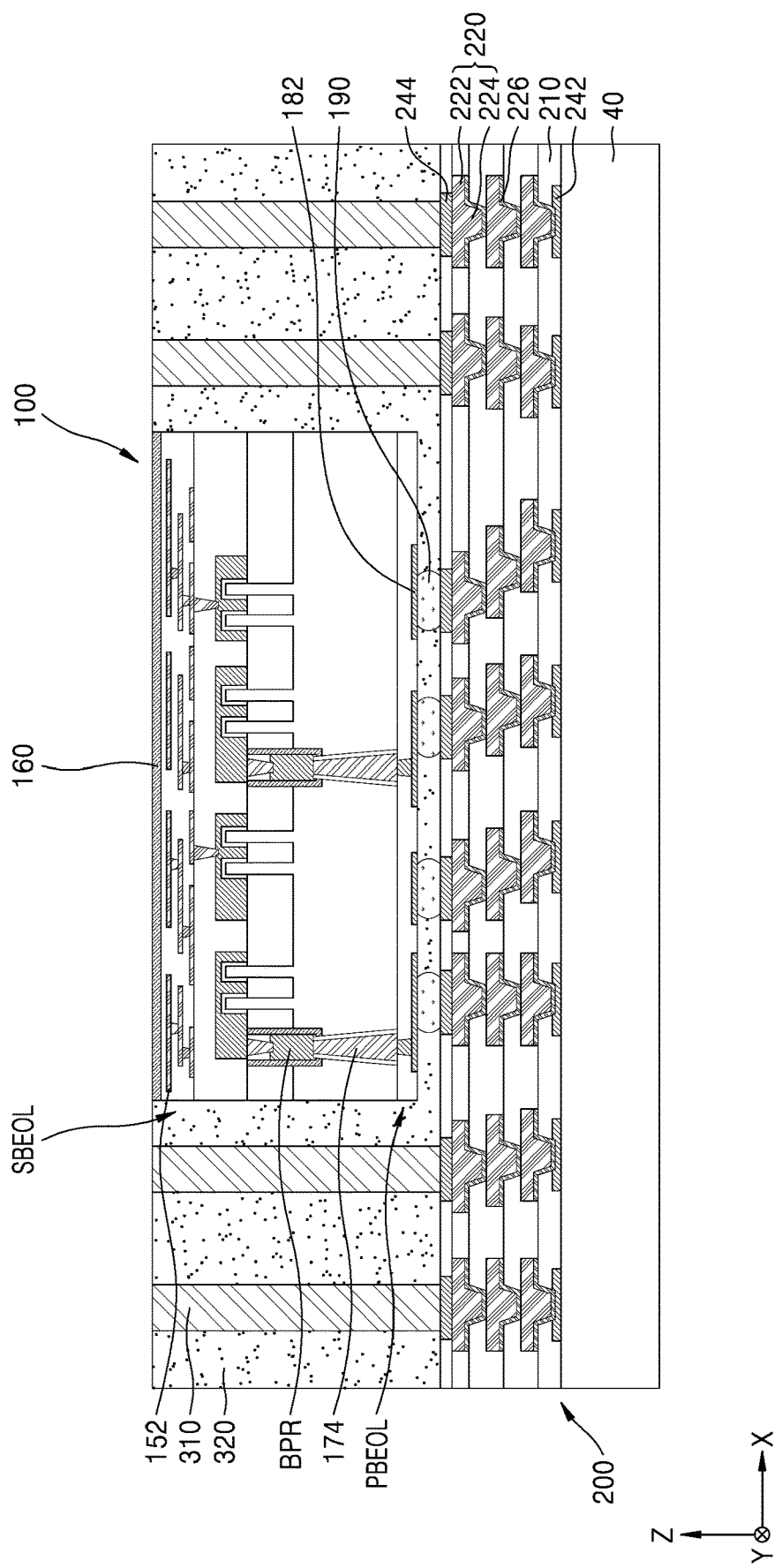

Referring to FIG. 3D, a planarization process may be performed until the passivation layer 160 of the lower semiconductor chip 100 is exposed, and as a result, portions of upper parts of the first molding 320 and the plurality of conductive connection structures 310 may be removed. A top surface of the first molding 320, a top surface of the plurality of conductive connection structures 310, and a top surface of the lower semiconductor chip 100 may be located at the same vertical level to be coplanar. For example, the top surface of the first molding 320, the top surface of the plurality of conductive connection structures 310, and a top surface of the passivation layer 160 may be located at the same vertical level to be coplanar.

Figure 3E:
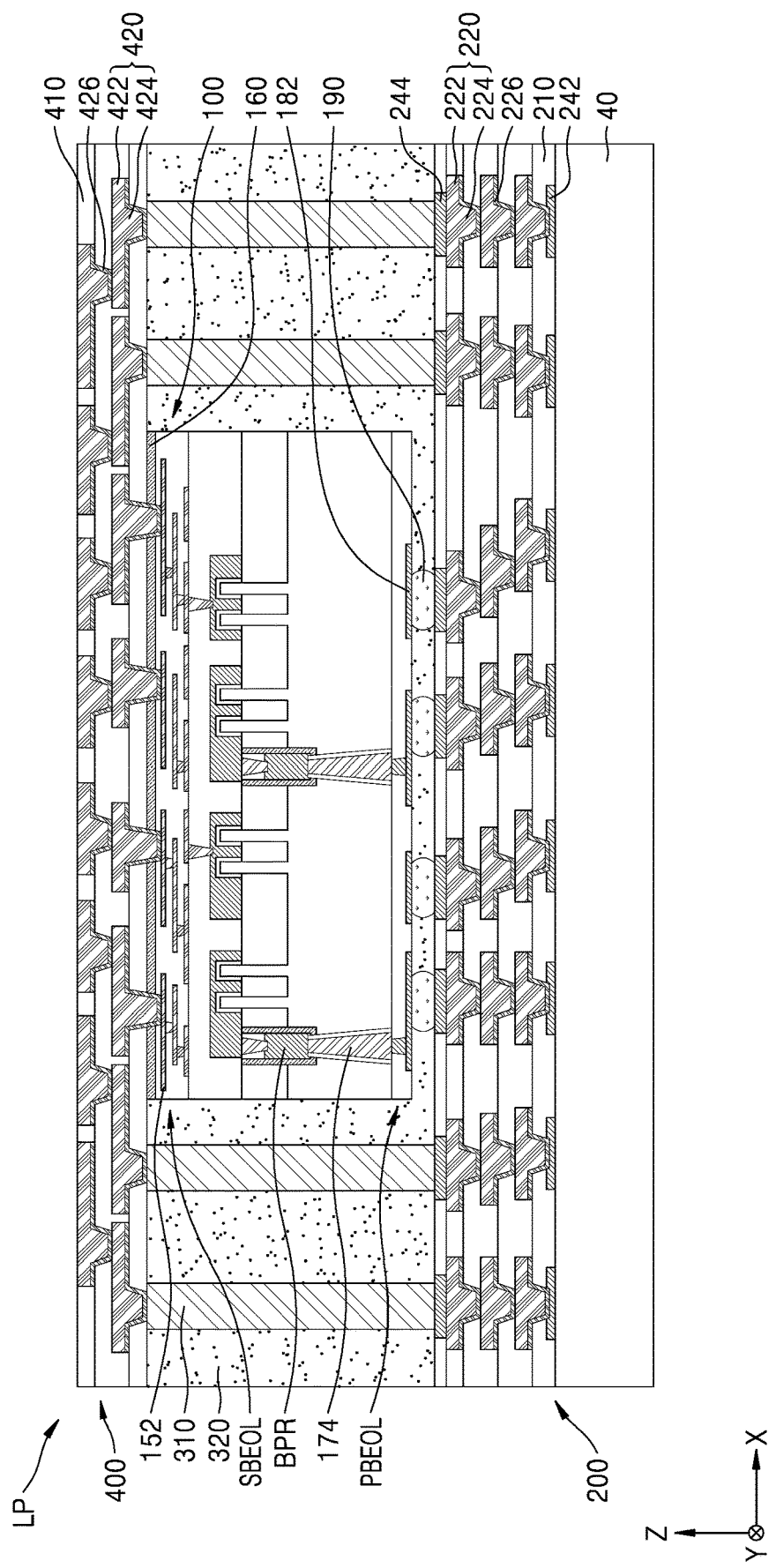

Referring to FIG. 3E, an upper redistribution layer 400 may be formed on the first molding 320. The upper redistribution layer 400 may include at least one upper redistribution insulating layer 410 and an upper redistribution conductive structure 420. The upper redistribution conductive structure 420 may include a plurality of upper redistribution line patterns 422 and a plurality of upper redistribution vias 424, wherein the plurality of upper redistribution line patterns 422 may be disposed on at least one surface of a top surface and a bottom surface of each of the plurality of upper redistribution insulating layers 410, and the plurality of upper redistribution vias 424 may penetrate at least one upper redistribution insulating layer 410 to respectively contact and connect to some of the plurality of upper redistribution line patterns 422. At least some of the plurality of upper redistribution line patterns 422 may be integrally formed together with some of the plurality of upper redistribution vias 424.

In some embodiments, the plurality of upper redistribution vias 424 may have a tapered shape in which the horizontal width thereof decreases from a top side to a bottom side thereof, for example, the plurality of upper redistribution vias 424 may increase in the horizontal width as the vias 424 moves away from the lower semiconductor chip 100.

An upper redistribution seed layer 426 may be disposed between the plurality of upper redistribution line patterns 422 and at least one upper redistribution insulating layer 410 and between the plurality of upper redistribution vias 424 and the at least one upper redistribution insulating layer 410.

Some of the plurality of upper redistribution vias 424 may be connected to the upper wiring structure SBEOL through the passivation layer 160. For example, some of the plurality of upper redistribution vias 424 may be connected to some of the plurality of upper wiring lines 152.

Each of the upper redistribution insulating layer 410, the upper redistribution line pattern 422, the upper redistribution via 424, and the upper redistribution seed layer 426 may be made of the same or similar material to each of the lower redistribution insulating layer 210, the lower redistribution line pattern 222, the lower redistribution via 224, and the lower redistribution seed layers 226, and may have generally similar shapes, and to the extent that a detailed description thereof is omitted, it may be understood that the elements not described herein are at least similar to corresponding elements that are described elsewhere in the instant specification.

In some embodiments, the number of stacks of the upper redistribution insulating layer 410 in the upper redistribution layer 400 may be less than the number of stacks of the lower redistribution insulating layer 210 in the lower redistribution layer 200. In some embodiments, the upper redistribution layer 400 may have wiring layers that are fewer in number than the lower redistribution layer 200. In some embodiments, a thickness of the upper redistribution layer 400 may be less than a thickness of the lower redistribution layer 200.

The lower redistribution layer 200, the upper redistribution layer 400, the lower semiconductor chip 100 between the lower redistribution layer 200 and the upper redistribution layer 400, the plurality of conductive connection structures 310, and the first molding 320 may be collectively referred to as a lower package LP.

Figure 3F:
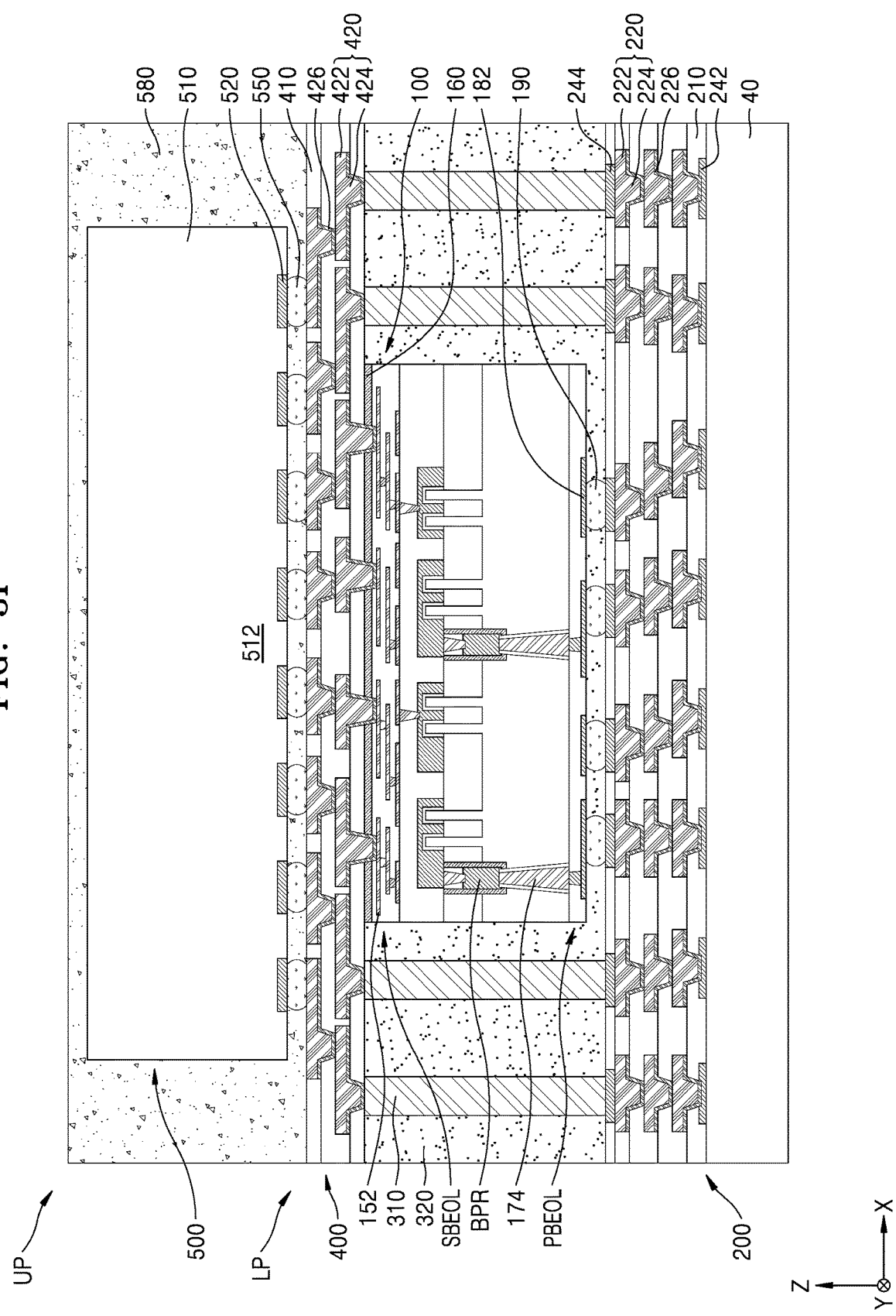

Referring to FIG. 3F, an upper package UP may be attached to the lower package LP. The upper package UP may include at least one upper semiconductor chip 500. In some embodiments, the upper package UP may further include a second molding 580 that at least partially surrounds the at least one upper semiconductor chip 500.

The upper semiconductor chip 500 may include a second semiconductor substrate 510 in which an upper semiconductor device 512 is disposed on an active plane thereof, and a plurality of upper chip connection pads 520 disposed on the active plane of the second semiconductor substrate 510. The upper package UP may be attached to the lower package LP with the active plane of the upper semiconductor chip 500 on which the upper semiconductor device 512 is disposed, facing the lower package LP. The active planes of the upper semiconductor chip 500 and the lower semiconductor chip 100 may face each other.

The second semiconductor substrate 510 may include a semiconductor material such as Si or Ge, or a compound semiconductor material such as SiGe, SiC, GaAs, InAs, or InP. The second semiconductor substrate 510 may include a conductive region, for example, a well doped with impurities, or a structure doped with impurities.

In some embodiments, the upper semiconductor chip 500 may be a logic semiconductor chip. For example, the upper semiconductor chip 500 may include a CPU chip, a GPU chip, or an AP chip, and the second semiconductor element 512 may function as a CPU, a GPU, or an AP.

In some embodiments, the upper semiconductor chip 500 may be a memory semiconductor chip. For example, the upper semiconductor chip 500 may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

In some embodiments, when the upper package UP has a plurality of upper semiconductor chips 500, some of the plurality of upper semiconductor chips 500 may be the CPU chip, the GPU chip, or the AP chip, and some other of the chips 500 may be the memory semiconductor chip.

In some embodiments, a plurality of second chip connection terminals 550 may be disposed between the upper semiconductor chip 500 and the upper redistribution layer 400. The plurality of second chip connection terminals 550 may connect some of the plurality of upper redistribution line patterns 422 to the plurality of upper chip connection pads 520.

FIG. 3F shows that the second molding 580 directly covers a top surface of the upper redistribution layer 400, but the present invention is not necessarily limited thereto. In some embodiments, the upper package UP may include a package substrate, the upper semiconductor chip 500 attached to the package substrate, the second molding 580 covering the package substrate and wrapping the upper semiconductor chip 500, and the plurality of second chip connection terminals 550 may be disposed between the package substrate and the upper redistribution layer 400.

In some embodiments, some of the plurality of upper redistribution line patterns 422 may directly contact and be electrically connected to the plurality of upper chip connection pads 520. For example, some of the plurality of upper redistribution line patterns 422 and the plurality of upper chip connection pads 520 may contact each other through thermal expansion, and then may form a plurality of coupling pads that are formed through diffusion bonding in which metal atoms therein are diffused to be one body.

Figure 4:
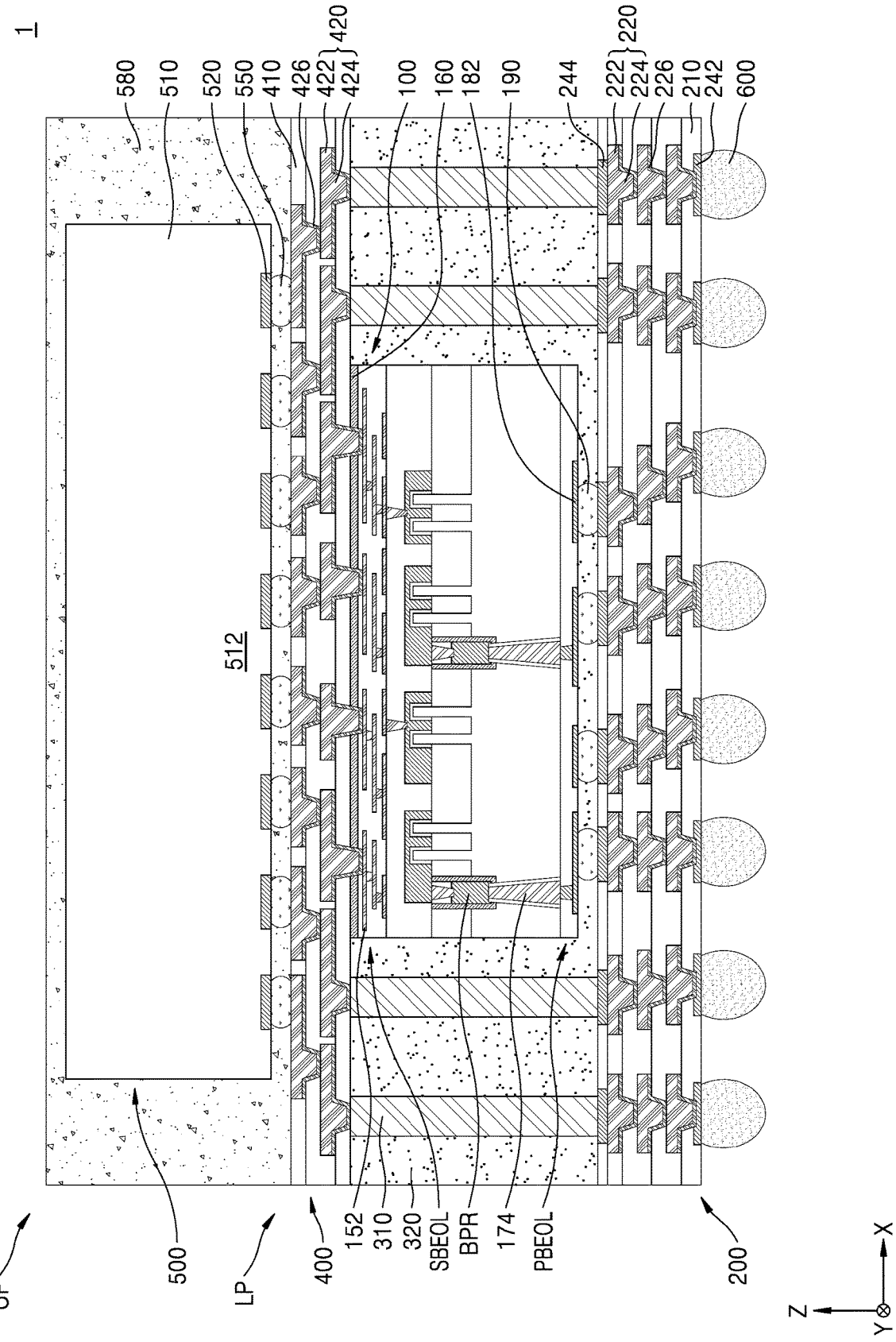
FIG. 4 is a cross-sectional view illustrating a semiconductor package according to example embodiments of the inventive concept.

FIG. 4 is a cross-sectional view illustrating a semiconductor package according to example embodiments of the inventive concept.

Referring to FIG. 3F and FIG. 4 together, the plurality of external connection pads 242 may be exposed by removing the second support substrate 40 from the lower redistribution layer 200. A plurality of external connection terminals 600 may be attached to the plurality of external connection pads 242 to form a semiconductor package 1.

The semiconductor package 1 may be a package-on-package (PoP) in which the upper package UP is attached to the lower package LP. The lower package LP may include the lower semiconductor chip 100 attached to the lower redistribution layer 200, the plurality of conductive connection structures 310, the first molding 320 at least partially surrounding the plurality of conductive connection structures 310 and the lower semiconductor chip 100, and the upper redistribution layer 400. The lower package LP may be a fan-out wafer level package (FOWLP). The upper semiconductor package UP may include the upper semiconductor chip 500 and the second molding 580 that at least partially surrounds the upper semiconductor chip 500. The upper package UP may be attached to the lower package LP such that the active plane of the upper semiconductor chip 500 faces the active plane of the lower semiconductor chip 100.

The lower semiconductor chip 100 and the upper semiconductor chip 500 may be formed such that their active planes face each other, and may transmit and receive signals such as the data signal and the control signal, except for power, to each other through the upper redistribution conductive structure 420 of the upper redistribution layer 400. Therefore, the lower semiconductor chip 100 and the upper semiconductor chip 500 may transmit and receive signals to each other with a fast speed and a wide bandwidth.

The lower semiconductor chip 100 may be provided with power through the plurality of buried power rails BPR, the plurality of through electrodes 174, and the lower redistribution conductive structure 220 of the lower redistribution layer 200, from an external source. In some embodiments, the lower semiconductor chip 100 may be provided with power through the plurality of buried power rails BPR, the plurality of through electrodes 174, the lower wiring structure PBEOL, and the lower redistribution conductive structure 220 of the lower redistribution layer 200, from an external source. The upper semiconductor chip 500 may be provided with power through the upper redistribution conductive structure 420 of the upper redistribution layer 400, some of the plurality of conductive connection structure 310 and the lower redistribution conductive structure 220 of the lower redistribution layer 200, from an external source.

At least one semiconductor chip of the lower semiconductor chip 100 and the upper semiconductor chip 500 may transmit and receive signals through the upper redistribution conductive structure 420 of the upper redistribution layer 400, some other of the plurality of conductive connection structures 310 and the lower redistribution conductive structure 220 of the lower redistribution layer 200, to and from an external source.

In the semiconductor package 1, according to the inventive concept, the lower semiconductor chip 100 may transmit and receive signals through the top surface thereof to and from the upper semiconductor chip 500 and may be provided with the external power through the bottom surface thereof, thereby shortening a signal transfer path between the lower semiconductor chip 100 and the upper semiconductor chip 500 and reducing the loss of power. Therefore, the lower semiconductor chip 100 and the upper semiconductor chip 500 may transmit and receive signals to each other with fast speed and wide bandwidth, and thus, the operating speed of the semiconductor package 1 may be increased. Further, in the semiconductor package 1, the signal transfer path and a power transfer path may be separated from each other to avoid signal interference due to power and reduce power loss, and therefore, the operation reliability of the semiconductor package 1 may be increased.

Figure 5:
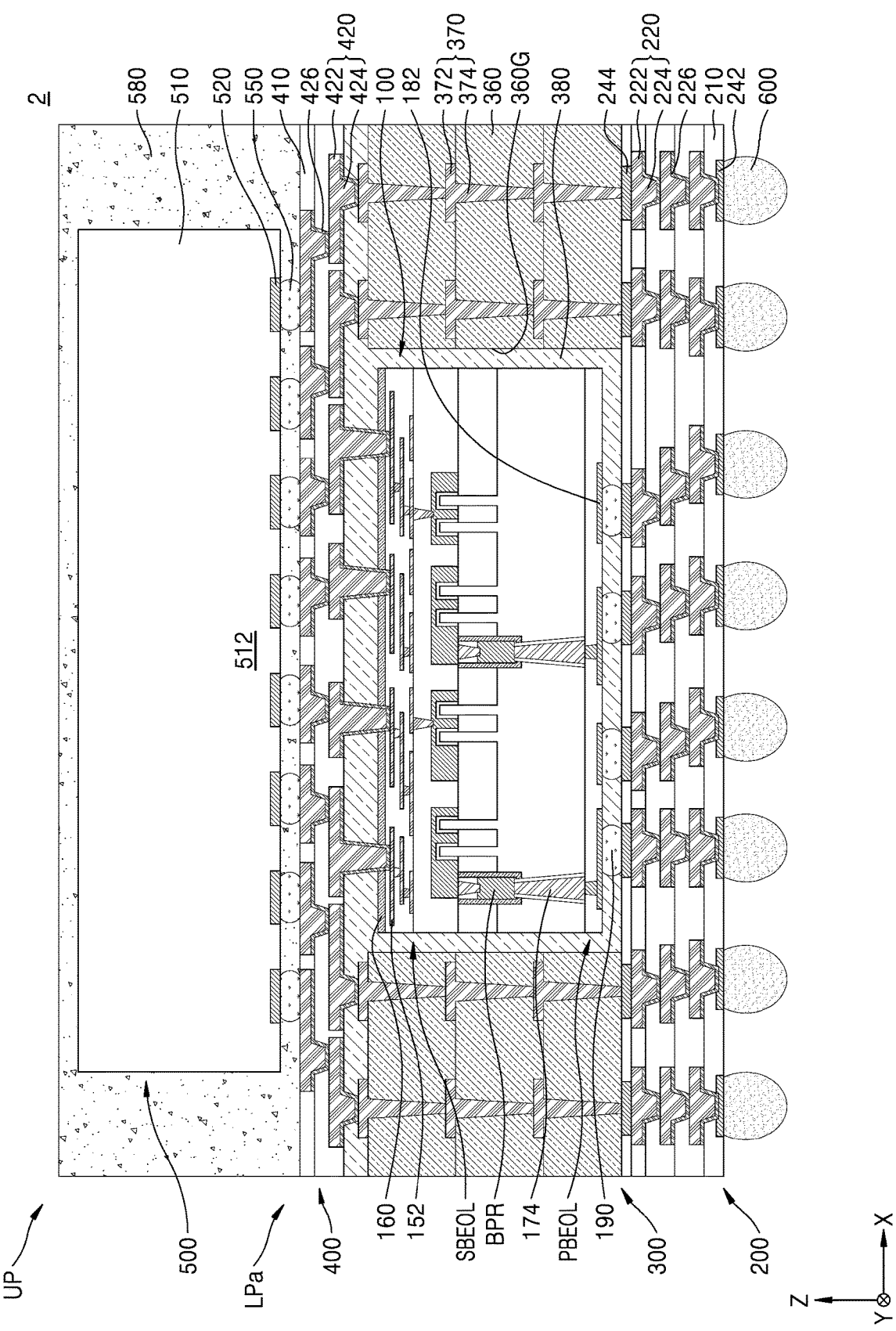
FIG. 5 is a cross-sectional view illustrating a semiconductor package according to example embodiments of the inventive concept.

FIG. 5 is a cross-sectional view illustrating a semiconductor package according to example embodiments of the inventive concept. For example, in FIG. 5, the same reference numbers as those of FIGS. 1 to 4 may denote the same or similar components, and the duplicate descriptions may be omitted.

Referring to FIG. 5, the semiconductor package 2 may be a package-on-package with the upper package UP on a lower package LPa. The lower package LPa may include an expansion layer 300 that is attached to the lower redistribution layer 200 and has a mounting space 360G, the lower semiconductor chip 100 that is accommodated in the mounting space 360G and is attached to the lower redistribution layer 200, the first molding 380 that at least partially surrounds the lower semiconductor chip 100 and fills the mounting space 360G, and the upper redistribution layer 400. The lower package LPa may be a fan-out panel level package (FOPLP). The upper semiconductor package UP may include the upper semiconductor chip 500 and the second molding 580 that at least partially surrounds the upper semiconductor chip 500. The upper package UP may be attached to the lower package LPa such that the active plane of the upper semiconductor chip 500 faces the active plane of the lower semiconductor chip 100.

The expansion layer 300 may at least partially surround a periphery of at least one semiconductor chip 100. In some embodiments, the expansion layer 300 may be a panel board. A horizontal width and a horizontal area of the mounting space 360G may be greater than the horizontal width and the horizontal area of the lower semiconductor chip 100, respectively. A side surface of the lower semiconductor chip 100 may be spaced apart from an inner side surface of the mounting space 360G.

The expansion layer (300) may include, for example, a printed circuit board (PCB), a ceramic substrate, a wafer for manufacturing a package, or an interposer. In some embodiments, the expansion layer 300 may be include a multi-layer printed circuit board. The mounting space 360G may be formed in the form of an opening or a cavity in the expansion layer 300. The mounting space 360G may be formed in a part of the expansion layer 300, for example, in a central region. The mounting space 360G may be recessed or opened from a top surface of the expansion layer 300 to a predetermined depth. In order to recess or open the expansion layer 300, dry etching, wet etching, screen printing, drill bit, or laser drilling processes, and the like may be used.

In some embodiments, the expansion layer 300 may include a substrate base 360 and a plurality of conductive connection structures 370 penetrating the substrate base 360.

The substrate base 360 may include a phenol resin, an epoxy resin, and/or a polyimide. The substrate base 360 may include, for example, frame retardant 4 (FR-4), tetrafunctional epoxy, polyphenylene ether, epoxy/polyphenylene oxide, bismaleimide triazine (BT), thermount, cyanate ester, polyimide, and/or liquid crystal polymer.

Each of the plurality of conductive connection structures 370 may include a plurality of wiring patterns 372 extending in the horizontal direction (the X direction and/or the Y direction) and a plurality of conductive vias 374 extending in the vertical direction (the Z direction). The plurality of conductive connection structures 370 may include copper, nickel, stainless steel, or beryllium copper.

In some embodiments, the expansion layer 300 may be a multi-layer substrate in which the substrate base 360 is formed in the form of a plurality of layers. The plurality of wiring patterns 372 in the expansion layer 300 may be disposed on at least a portion among a top surface and a bottom surface of the plurality of layers which form the substrate base 360.

The plurality of conductive vias 374 in the expansion layer 300 may penetrate at least a portion of the substrate base 360 to electrically connect the wiring patterns 372 arranged in different wiring layers to each other.

The first molding 380 may fill a space between the lower semiconductor chip 100 and the expansion layer 300. For example, the first molding 380 may include a thermosetting resin such as an epoxy resin, a thermoplastic resin such as a polyimide, or resin containing a reinforcing material such as an inorganic filler, and for example, may include Ajinomoto build-up film (ABF), FR-4, and BT, and the like. In addition, the first molding 380 may include a molding material such as an epoxy molding compound (EMC) or a photosensitive material such as a photoimagable encapsulant (PIE). In some embodiments, the first molding 380 may cover the top surface of the expansion layer 300.

In some embodiments, the first molding 380 may be formed by depositing a silicon oxide on exposed portions within the mounting space 360G with a predetermined thickness and then filling a portion of the mounting space 360G not filled by the silicon oxide with polymer such as polyimide.

In some embodiments, as the polymer such as polyimide covers the top surfaces of the lower semiconductor chip 100 and the expansion layer 300, the first molding 380 may at least partially surround the side surface and the top surface of the lower semiconductor chip 100.

In some embodiments, after the polymer such as polyimide fills the mounting space 360G, an insulating material may then cover the polymer and the expansion layer 300 to form the first molding 380. The insulating material may include, for example, a silicon oxide film, a silicon nitride film, or a silicon oxynitride film.

The upper redistribution layer 400 may be disposed on the first molding 380. The upper redistribution layer 400 may include at least one upper redistribution insulating layer 410 and the upper redistribution conductive structure 420. The upper redistribution conductive structure 420 may include the plurality of upper redistribution line patterns 422 and the plurality of upper redistribution vias 424, wherein the plurality of upper redistribution line patterns 422 may be disposed on at least one surface of the top surface and the bottom surface of each of the plurality of upper redistribution insulating layers 410, and the plurality of upper redistribution vias 424 may penetrate at least one upper redistribution insulating layer 410 to respectively contact and connect to some of the plurality of upper redistribution line patterns 422. In some embodiments, the plurality of upper redistribution vias 424 may have the tapered shape in which the horizontal width thereof decreases from the top side to the bottom side.

An upper redistribution seed layer 426 may be disposed between the plurality of upper redistribution line patterns 422 and at least one upper redistribution insulating layer 410 and between the plurality of upper redistribution vias 424 and the at least one upper redistribution insulating layer 410.

Some of the plurality of upper redistribution vias 424 may be connected to the upper wiring structure SBEOL by penetrating the first molding 380 and the passivation layer 160.

The lower semiconductor chip 100 and the upper semiconductor chip 500 may be formed such that their active planes face each other, and may transmit and receive signals such as the data signal and the control signal, except for power, to each other through the upper redistribution conductive structure 420 of the upper redistribution layer 400. Therefore, the lower semiconductor chip 100 and the upper semiconductor chip 500 may transmit and receive signals to each other with fast speed and wide bandwidth.

The lower semiconductor chip 100 may be provided with power through the plurality of buried power rails BPR, the plurality of through electrodes 174, and the lower redistribution conductive structure 220 of the lower redistribution layer 200, from an external source. In some embodiments, the lower semiconductor chip 100 may be provided with power through the plurality of buried power rails BPR, the plurality of through electrodes 174, the lower wiring structure PBEOL, and the lower redistribution conductive structure 220 of the lower redistribution layer 200, from an external source. The upper semiconductor chip 500 may receive power through the upper redistribution conductive structure 420 of the upper redistribution layer 400, some of the plurality of conductive connection structure 370 and the lower redistribution conductive structure 220 of the lower redistribution layer 200, from an external source.

At least one semiconductor chip of the lower semiconductor chip 100 and the upper semiconductor chip 500 may transmit and receive signals through the upper redistribution conductive structure 420 of the upper redistribution layer 400, some other of the plurality of conductive connection structures 370 and the lower redistribution conductive structure 220 of the lower redistribution layer 200, to and from an external source.

In the semiconductor package 2, according to the inventive concept, the lower semiconductor chip 100 may transmit and receive signals through the top surface thereof to and from the upper semiconductor chip 500 and may be provided with external power through the bottom surface thereof, thereby shortening a signal transfer path between the lower semiconductor chip 100 and the upper semiconductor chip 500. Therefore, the lower semiconductor chip 100 and the upper semiconductor chip 500 may transmit and receive signals to each other with fast speed and wide bandwidth, and thus, the operating speed of the semiconductor package 2 may be increased. Further, in the semiconductor package 2, the signal transfer path and the power transfer path may be separated from each other to avoid signal interference due to power, and therefore, the operation reliability of the semiconductor package 2 may be increased.

Figure 6:
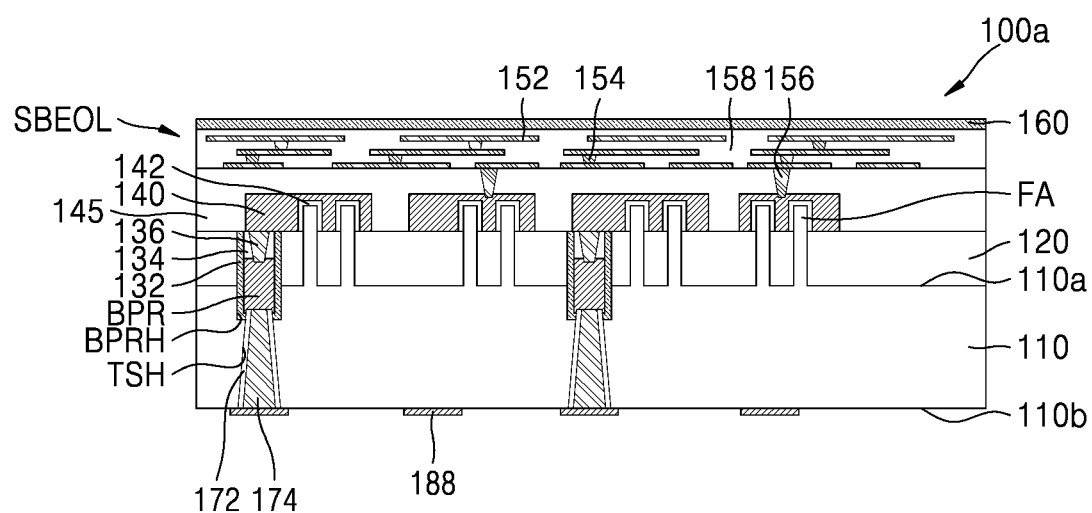
FIG. 6 is a cross-sectional view illustrating a lower semiconductor chip of a semiconductor package according to example embodiments of the inventive concept.

FIG. 6 is a cross-sectional view illustrating a lower semiconductor chip of a semiconductor package according to example embodiments of the inventive concept. In FIG. 6, the same reference number as that shown in FIG. 1 may represent the same or similar components, and the duplicate descriptions may be omitted.

Referring to FIG. 6, the lower semiconductor chip 100a may include the first semiconductor substrate 110 having the first surface 110a and the second surface 110b opposite to each other, and the plurality of fin-type active regions FA which protrude upwardly from the first surface 110a of the first semiconductor substrate 110.

The plurality of fin-type active regions FA may protrude upwardly from the main surface, for example, the first surface 110a of the first semiconductor substrate 110 in the vertical direction (the Z direction). The device isolation film 120 covering sidewalls of portions of lower ends of the plurality of fin-type active regions FA may be respectively formed between the plurality of fin-type active regions FA. The plurality of fin-type active regions FA may protrude upwardly from the device isolation film 120 in a fin shape.

On the first semiconductor substrate 110, the plurality of gate lines 140 may extend in the direction crossing the plurality of fin-type active regions FA. The gate insulating film 142 may be disposed between the gate line 140 and the fin-type active region FA. The interlayer insulating layer 145 may cover the device isolation film 120 and the plurality of gate lines 140.

In some embodiments, the lower semiconductor chip 100a may be the logic semiconductor chip. For example, the lower semiconductor chip 100a may be the central processing device chip, the graphic processing apparatus chip, or the application processor chip.

The upper wiring structure SBEOL may be disposed on the interlayer insulating layer 145. The upper wiring structure SBEOL may include the plurality of upper wiring lines 152, the plurality of upper wiring vias 154, the plurality of connection vias 156, and the upper interwire insulating layer 158 that at least partially surrounds the plurality of upper wiring lines 152 and the plurality of upper wiring vias 154. The plurality of connection vias 156 may electrically connect the plurality of upper wiring lines 152 to the plurality of gate lines 140.

The passivation layer 160 may cover the upper wiring structure SBEOL.

The plurality of buried rail holes BPRH may extend between the plurality of gate lines 140 and the plurality of through electrodes 174 by penetrating the device isolation film 120 and then extending into the first semiconductor substrate 110. The plurality of buried rail holes BPRH may be spaced apart from the plurality of fin-type active regions FA. The plurality of buried power rails BPR may be disposed in the plurality of buried rail holes BPRH, and the buried rail insulating layer 132 may be disposed between the buried power rail BPR and the first semiconductor substrate 110.

In some embodiments, the buried power rail BPR may fill only the lower portion of the buried rail hole BPRH, and the buried insulating layer 134 may fill the upper portion of the buried rail hole BPRH. The power via 136 penetrating the buried insulating layer 134 may be disposed between the buried power rail BPR and the gate line 140, thereby electrically connecting the buried power rail BPR to the gate line 140.

The through hole TSH may extend from the second surface 110b of the first semiconductor substrate 110 into the first semiconductor substrate 110 and may communicate with the buried rail hole BPRH. In some embodiments, the through hole TSH may have the tapered shape wherein the horizontal width of the through hole TSH decreases while extending from the second surface 110b of the first semiconductor substrate 110 into the first semiconductor substrate 110 and to the buried power rail BPR. The through hole TSH may be filled by the through electrode 174 and the via insulating film 172 between the first semiconductor substrate 110 and the through electrode 174.

A plurality of lower wiring pads 188 may be disposed on the second surface 110b of the first semiconductor substrate 110. The plurality of lower wiring pads 188 may be connected to the plurality of through electrodes 174. In some embodiments, the plurality of lower wiring pads 188 may cover a bottom surface of the plurality of through electrodes 174.

The lower semiconductor chip 100a may have the plurality of lower wiring pads 188, without the lower wiring structure PBEOL that is included in the lower semiconductor chip 100 shown in FIG. 1.

The lower semiconductor chip 100a may transmit and receive signals such as a data signal and a control signal, except for power, to and from an external source through the upper wiring structure SBEOL, and may be provided with the external power through the plurality of lower wiring pads 188.

The lower semiconductor chip 100a, according to the inventive concept, may transmit and receive signals such as a data signal and a control signal, except for power, through the upper wiring structure SBEOL disposed on the first surface 110a of the first semiconductor substrate 110, and may be provided with the external power through the plurality of lower wiring pads 188 disposed on the second surface 110b of the first semiconductor substrate 110. Therefore, in the lower semiconductor chip 100a, the signal and power may be separately provided through the upper portion and the lower portion, respectively, and thus the interference between the signal and power may be minimized. In addition, even when the degree of integration of the lower semiconductor chip 100a increases, such as when widths of the plurality of fin-type active regions FA are reduced, the signal and power may be stably provided to the lower semiconductor chip 100a.

Figure 7:
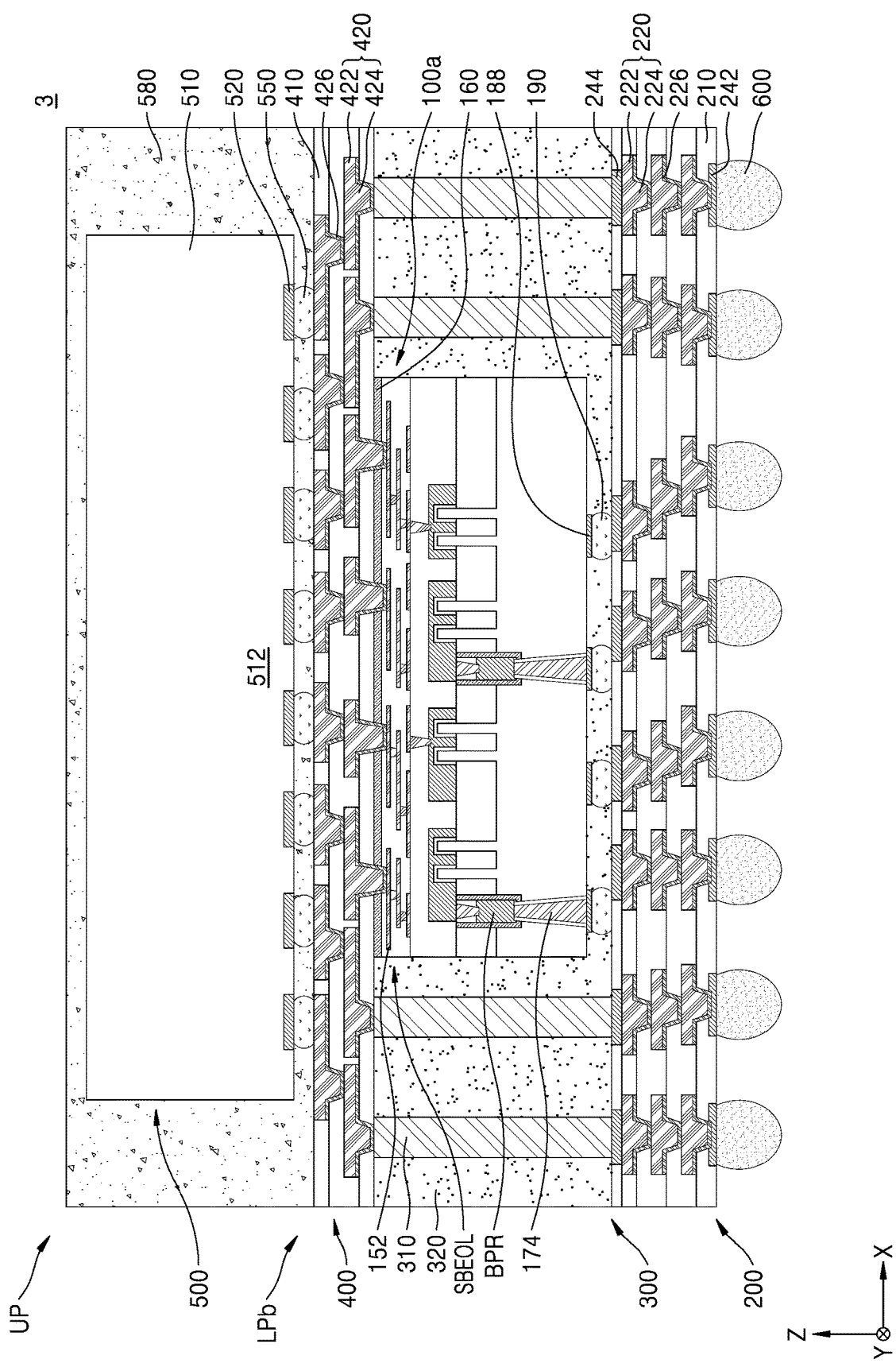
FIG. 7 is a cross-sectional view illustrating a semiconductor package according to example embodiments of the inventive concept.

FIG. 7 is a cross-sectional view illustrating a semiconductor package according to example embodiments of the inventive concept. In FIG. 7, the same reference numbers as that shown in FIGS. 4 and 6 may represent the same or similar components, and the duplicate descriptions may be omitted.

Referring to FIG. 7, the semiconductor package 3 may be a package-on-package with the upper package UP on a lower package LPb. The lower package LPb may include the lower semiconductor chip 100a attached to the lower redistribution layer 200, the plurality of conductive connection structures 310, the first molding 320 at least partially surrounding the plurality of conductive connection structures 310 and the lower semiconductor chip 100a, and the upper redistribution layer 400. The upper semiconductor package UP may include the upper semiconductor chip 500 and the second molding 580 that at least partially surrounds the upper semiconductor chip 500. The upper package UP may be attached to the lower package LPb such that the active plane of the upper semiconductor chip 500 faces the active plane of the lower semiconductor chip 100.

The lower semiconductor chip 100a may be attached to some other of the plurality of lower connection pads 244. The plurality of first chip connection terminals 190 may be disposed between the lower semiconductor chip 100 and the plurality of lower connection pads 244. The plurality of first chip connection terminals 190 may connect the plurality of lower wiring pads 188 of the lower semiconductor chip 100a to the plurality of lower connection pads 244.

The lower semiconductor chip 100a and the upper semiconductor chip 500 may be formed such that their active planes face each other, and may transmit and receive signals such as the data signal and the control signal, except for power, to each other through the upper redistribution conductive structure 420 of the upper redistribution layer 400. Therefore, the lower semiconductor chip 100a and the upper semiconductor chip 500 may transmit and receive signals to each other with fast speed and wide bandwidth.

The lower semiconductor chip 100a may be provided with power through the plurality of buried power rails BPR, the plurality of through electrodes 174, and the lower redistribution conductive structure 220 of the lower redistribution layer 200, from an external source. In some embodiments, the lower semiconductor chip 100a may be provided with power through the plurality of buried power rails BPR, the plurality of through electrodes 174, the lower wiring structure PBEOL, and the lower redistribution conductive structure 220 of the lower redistribution layer 200, from an external source. The upper semiconductor chip 500 may be provided with power through the upper redistribution conductive structure 420 of the upper redistribution layer 400, some of the plurality of conductive connection structure 310 and the lower redistribution conductive structure 220 of the lower redistribution layer 200, from an external source.

At least one semiconductor chip of the lower semiconductor chip 100a and the upper semiconductor chip 500 may transmit and receive signals through the upper redistribution conductive structure 420 of the upper redistribution layer 400, some other of the plurality of conductive connection structures 310 and the lower redistribution conductive structure 220 of the lower redistribution layer 200, to and from an external source.

In the semiconductor package 3, according to the inventive concept, the lower semiconductor chip 100a may transmit and receive signals through the top surface thereof to and from the upper semiconductor chip 500 and may receive the external power through the bottom surface thereof, thereby shortening a signal transfer path between the lower semiconductor chip 100a and the upper semiconductor chip 500. Therefore, the lower semiconductor chip 100a and the upper semiconductor chip 500 may transmit and receive signals to each other with fast speed and wide bandwidth, and thus, the operating speed of the semiconductor package 3 may be increased. Further, in the semiconductor package 3, the signal transfer path and the power transfer path may be separated from each other to avoid signal interference due to power, and therefore, the operation reliability of the semiconductor package 3 may be increased.

Figure 8:
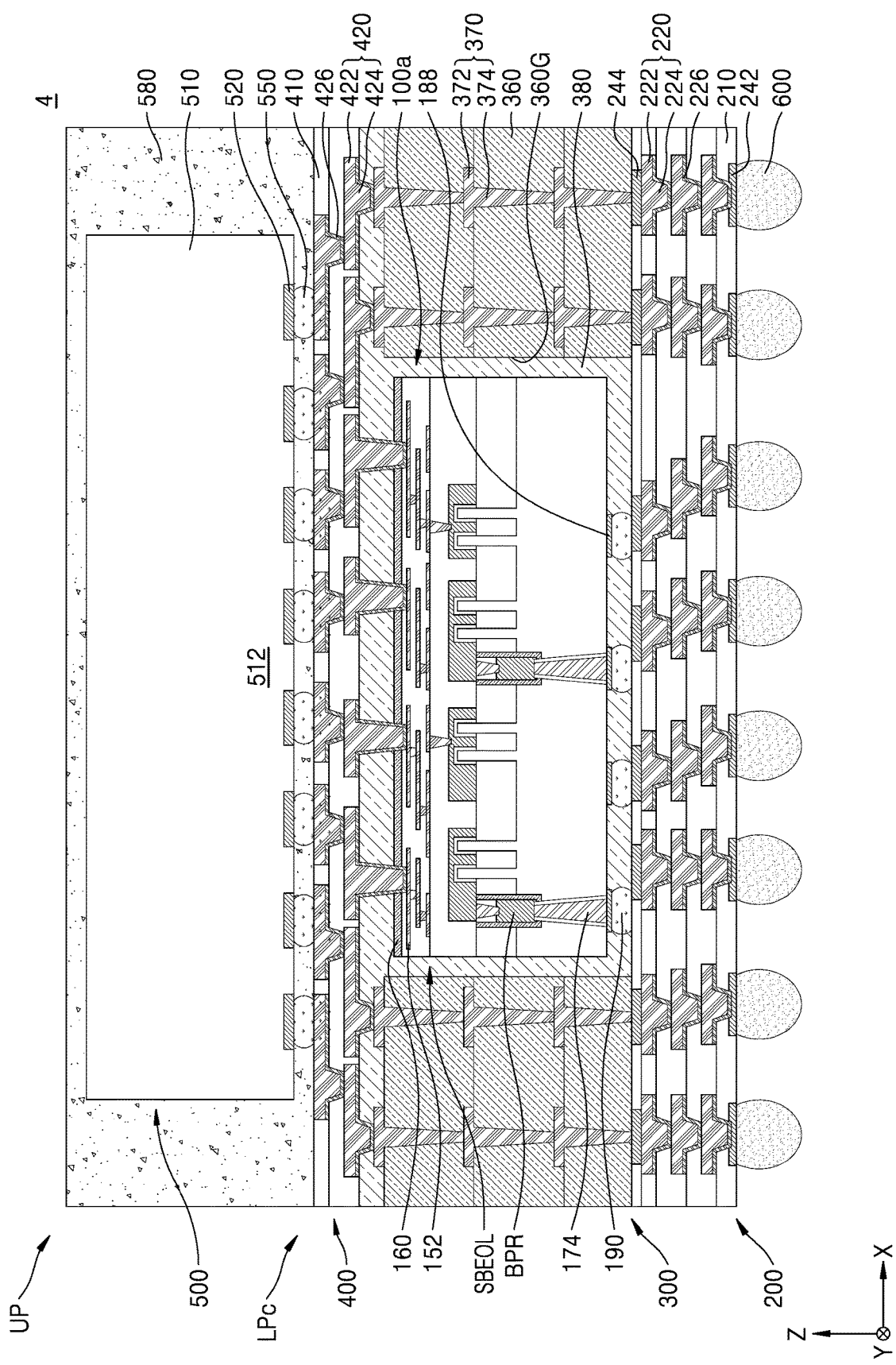
FIG. 8 is a cross-sectional view illustrating a semiconductor package according to example embodiments of the inventive concept.

FIG. 8 is a cross-sectional view illustrating a semiconductor package according to example embodiments of the inventive concept. For example, in FIG. 8, the same reference numbers as those of FIGS. 5 to 7 may denote the same or similar components, and the duplicate descriptions may be omitted.

Referring to FIG. 8, the semiconductor package 4 may be a package-on-package with the upper package UP on a lower package LPc. The lower package LPc may include the expansion layer 300 that is attached to the lower redistribution layer 200 and has the mounting space 360G, the lower semiconductor chip 100a that is accommodated in the mounting space 360G and is attached to the lower redistribution layer 200, the first molding 380 that at least partially surrounds the lower semiconductor chip 100a and fills the mounting space 360G, and the upper redistribution layer 400. The lower package LPc may be a fan-out panel-level package. The upper semiconductor package UP may include the upper semiconductor chip 500 and the second molding 580 that at least partially surrounds the upper semiconductor chip 500. The upper package UP may be attached to the lower package LPc such that the active plane of the upper semiconductor chip 500 faces the active plane of the lower semiconductor chip 100.

The expansion layer 300 may at least partially surround a periphery of at least one semiconductor chip 100a. The horizontal width and a horizontal area of the mounting space 360G may be greater than the horizontal width and the horizontal area of the lower semiconductor chip 100a. The side surface of the lower semiconductor chip 100a may be spaced apart from the inner side surface of the mounting space 360G.

The upper redistribution layer 400 may be disposed on the first molding 380. The upper redistribution layer 400 may include at least one upper redistribution insulating layer 410 and the upper redistribution conductive structure 420.

The lower semiconductor chip 100a and the upper semiconductor chip 500 may be formed such that their active planes face each other, and may transmit and receive signals such as the data signal and the control signal, except for power, to each other through the upper redistribution conductive structure 420 of the upper redistribution layer 400. Therefore, the lower semiconductor chip 100a and the upper semiconductor chip 500 may transmit and receive signals to each other with fast speed and wide bandwidth.

The lower semiconductor chip 100a may be provided with power through the plurality of buried power rails BPR, the plurality of through electrodes 174, and the lower redistribution conductive structure 220 of the lower redistribution layer 200, from an external source. In some embodiments, the lower semiconductor chip 100a may be provided with power through the plurality of buried power rails BPR, the plurality of through electrodes 174, the plurality of the lower wiring pads 188, and the lower redistribution conductive structure 220 of the lower redistribution layer 200, from an external source. The upper semiconductor chip 500 may be provided with power through the upper redistribution conductive structure 420 of the upper redistribution layer 400, some of the plurality of conductive connection structure 370 and the lower redistribution conductive structure 220 of the lower redistribution layer 200, from an external source.

At least one semiconductor chip of the lower semiconductor chip 100a and the upper semiconductor chip 500 may transmit and receive signals through the upper redistribution conductive structure 420 of the upper redistribution layer 400, some other of the plurality of conductive connection structures 310 and the lower redistribution conductive structure 220 of the lower redistribution layer 200, from an external source.

In the semiconductor package 4, according to the inventive concept, the lower semiconductor chip 100a may transmit and receive signals through the top surface thereof to and from the upper semiconductor chip 500 and may receive the external power through the bottom surface thereof, thereby shortening a signal transfer path between the lower semiconductor chip 100a and the upper semiconductor chip 500. Therefore, the lower semiconductor chip 100 and the upper semiconductor chip 500 may transmit and receive signals to each other with fast speed and wide bandwidth, and thus, the operating speed of the semiconductor package 4 may be increased. Further, in the semiconductor package 4, the signal transfer path and the power transfer path may be separated from each other to avoid signal interference due to power, and therefore, the operation reliability of the semiconductor package 4 may be increased.

FIG. 9 is a cross-sectional view illustrating an operation of a semiconductor package according to example embodiments of the inventive concept. For example, FIG. 9 is a cross-sectional view illustrating the operation of the semiconductor package 1 shown in FIG. 4, and the same reference numbers as FIG. 4 may represents the same or similar components, and redundant descriptions may be omitted.

Referring to FIG. 9, the semiconductor package 1 may be the package-on-package with the upper package UP on a lower package LP. The lower package LP may include the lower semiconductor chip 100 attached to the lower redistribution layer 200, the plurality of conductive connection structures 310, the first molding 320 at least partially surrounding the plurality of conductive connection structures 310 and the lower semiconductor chip 100, and the upper redistribution layer 400. The upper semiconductor package UP may include the upper semiconductor chip 500 and the second molding 580 that at least partially surrounds the upper semiconductor chip 500. The upper package UP may be attached to the lower package LPb such that the active plane of the upper semiconductor chip 500 faces the active plane of the lower semiconductor chip 100.

When the semiconductor package 1 operates, a lower power path LPP, an upper power path UPP, an internal signal path ISP, and an external signal path OSP may be generated. The lower semiconductor chip 100 may be provided with the external power through the lower power path LPP. The upper semiconductor chip 500 may be provided with the external power through the upper power path UPP. Therefore, the lower semiconductor chip 100 and the upper semiconductor chip 500 may transmit and receive signals to each other through the internal signal path ISP. At least one semiconductor chip of the lower semiconductor chip 100 and the upper semiconductor chip 500 may transmit and receive signals to and from an external source through the external signal path OSP.

The lower power path LPP may be generated along the external connection terminal 600, the plurality of external connection pads 242, the lower redistribution conductive structure 220 of the lower redistribution layer 200, the plurality of lower connection pads 244, the plurality of first chip connection terminal 190, the lower wiring structure PBEOL, the plurality of through electrodes 174, and the plurality of buried power rails BPR.

In some embodiments, the upper power path UPP may be generated along the external connection terminal 600, the plurality of external connection pads 242, the lower redistribution conductive structure 220 of the lower redistribution layer 200, the plurality of lower connection pads 244, some of the plurality of conductive connection structures 310, the upper redistribution conductive structure 420 of the upper redistribution layer 400, and the plurality of second chip connection terminals 550.

In some embodiments, the internal signal path ISP may be generated along the upper wiring structure SBEOL, the upper redistribution conductive structure 420 of the upper redistribution layer 400, the plurality of second chip connection terminals 550, and the plurality of upper chip connection pads 520.

In some embodiments, when the semiconductor package 1 does not have the plurality of second chip connecting terminals 550, the upper power path UPP may be generated along the external connection terminal 600, the plurality of external connection pads 242, the lower redistribution conductive structure 220 of the lower redistribution layer 200, the plurality of lower connection pads 244, some of the plurality of conductive connection structures 310, and the upper redistribution conductive structure 420 of the upper redistribution layer 400, and the internal signal path ISP may be generated along the upper wiring structure SBEOL, the upper redistribution conductive structure 420 of the upper redistribution layer 400, and the plurality of upper chip connection pads 520.

The external signal path OSP may be generated along the external connection terminal 600, the plurality of external connection pads 242, the lower redistribution conductive structure 220 of the lower redistribution layer 200, the plurality of lower connection pads 244, some of the plurality of conductive connection structures 310, and the upper redistribution conductive structure 420 of the upper redistribution layer 400.

When the external signal path OSP transmits and receive the signal between the lower semiconductor chip 100 and the outside, the external signal path OSP may be generated along the external connection terminal 600, the plurality of external connection pads 242, the lower redistribution conductive structure 220 of the lower redistribution layer 200, the plurality of lower connection pads 244, some of the plurality of conductive connection structures 310, the upper redistribution conductive structure 420 of the upper redistribution layer 400, and upper wiring structure SBEOL. When the external signal path OSP transmits and receive the signal between the upper semiconductor chip 500 and the outside, the external signal path OSP may be generated along the external connection terminal 600, the plurality of external connection pads 242, the lower redistribution conductive structure 220 of the lower redistribution layer 200, the plurality of lower connection pads 244, some of the plurality of conductive connection structures 310, the upper redistribution conductive structure 420 of the upper redistribution layer 400, and the plurality of second chip connection terminals 550.

In the semiconductor package 1, the number of signals transmitted and received through the internal signal path ISP may be greater than the number of signals transmitted and received through the external signal path OSP. An extension length of the external signal path OSP may be greater than the extension length of the internal signal path ISP. A bandwidth of the internal signal path ISP may be greater than the bandwidth of the external signal path OSP.

In the semiconductor package 1, the internal signal path ISP having a greater number of signals may be short in the extension length and be wide in bandwidth, and thus, the operating speed thereof may be increased. Further, in the semiconductor package 1, the signal transfer path and the power transfer path may be separated from each other to avoid signal interference due to power, and therefore, the operation reliability of the semiconductor package 1 may be increased.

Operations of the semiconductor packages 2, 3, and 4 shown in FIGS. 5, 7, and 8 are also generally similar to that of the semiconductor package 1 described with reference to FIG. 9, and to the extent that a detailed description thereof is omitted, it may be understood that the elements not described herein are at least similar to corresponding elements that are described elsewhere in the instant specification.

In the semiconductor package 2 shown in FIG. 5, the external signal path OSP and the upper power path UPP may be generated through the plurality of conductive connection structures 370 instead of the plurality of conductive connection structures 310 of the semiconductor package 1 shown in FIG. 9.

In the semiconductor package 3 shown in FIG. 7, the lower power path LPP may be generated through the plurality of lower wiring pads 188 instead of the lower wiring structure PBEOL of the semiconductor package 1 shown in FIG. 9.

In the semiconductor package 4 shown in FIG. 8, the external signal path OSP and the upper power path UPP may be generated through the plurality of conductive connection structures 370 instead of the plurality of conductive connection structures 310 of the semiconductor package 1 shown in FIG. 9, and the lower power path LPP may be generated through the plurality of lower wiring pads 188 instead of the lower wiring structure PBEOL of the semiconductor package 1 shown in FIG. 9.

While various embodiments of the inventive concept has been particularly shown and described herein, it will be understood that various changes in form and details may be made therein without departing from the spirit and scope of the present disclosure.

What is claimed is:

1. A semiconductor package, comprising:
    a lower redistribution layer including a lower redistribution conductive structure;
    a lower semiconductor chip disposed on the lower redistribution layer;
    a plurality of conductive connection structures attached to the lower redistribution layer;
    an upper redistribution layer having an upper redistribution conductive structure disposed on the lower semiconductor chip and the plurality of conductive connection structures; and
    an upper semiconductor chip having an active plane corresponding to an active plane of the lower semiconductor chip and disposed on the upper redistribution layer, the upper semiconductor chip being electrically connected to the upper redistribution conductive structure;
    wherein the lower semiconductor chip comprises:
        a semiconductor substrate having a first surface and a second surface opposite to the first surface;
        an upper wiring structure disposed on the first surface of the semiconductor substrate and electrically connected to the upper redistribution conductive structure;
        a buried power rail filling a portion of a buried rail hole extending from the first surface of the semiconductor substrate toward the second surface thereof; and
        a through electrode filling a through hole extending from the second surface of the semiconductor substrate toward the first surface thereof, the through electrode electrically connecting the buried power rail to the lower redistribution conductive structure.

2. The semiconductor package of claim 1, wherein a top surface of the lower semiconductor chip and top surfaces of the plurality of conductive connection structures are at a same vertical level.

3. The semiconductor package of claim 1, further comprising:
    a molding at least partially surrounding the lower semiconductor chip and the plurality of conductive connection structures, the molding disposed on the lower redistribution layer,
    wherein a top surface of the lower semiconductor chip, top surfaces of the plurality of conductive connection structures, and a top surface of the molding are disposed on a same plane.

4. The semiconductor package of claim 3, wherein the lower semiconductor chip further comprises a passivation layer at least partially covering the upper wiring structure, and a top surface of the passivation layer, the top surfaces of the plurality of conductive connection structures, and
    wherein the top surface of the molding are at a same vertical level.

5. The semiconductor package of claim 1, wherein a thickness of the lower redistribution layer is greater than a thickness of the upper redistribution layer.

6. The semiconductor package of claim 1, wherein each of the lower semiconductor chip and the upper semiconductor chip comprises a logic semiconductor chip.

7. The semiconductor package of claim 1, wherein the lower semiconductor chip further comprises: a plurality of fin-type active regions protruding upwardly from the first surface of the semiconductor substrate; and a gate line extending in a direction crossing the plurality of fin-type active regions, and
    the buried rail hole is spaced apart from the plurality of fin-type active regions and extends between the gate line and the through electrode.

8. The semiconductor package of claim 1, further comprising
    a substrate base having a mounting space accommodating the lower semiconductor chip, the substrate base disposed on the lower redistribution layer; and
    a molding at least partially filling the mounting space,
    wherein the plurality of conductive connection structures penetrates the substrate base.

9. The semiconductor package of claim 1, wherein the lower semiconductor chip further comprises a lower wiring structure covering the second surface of the semiconductor substrate, the lower wiring structure comprising a lower wiring line, a lower wiring via, and a lower interwire insulating layer at least partially surrounding the lower wiring line and the lower wiring via, and
    the through electrode and the lower redistribution conductive structure are electrically connected to each other, through the lower wiring line, the lower wiring via, and a chip connection terminal between the lower wiring structure and the lower redistribution conductive structure.

10. The semiconductor package of claim 1, wherein the lower semiconductor chip further comprises a lower wiring pad covering a bottom surface of the through electrode, and the through electrode and the lower redistribution conductive structure are electrically connected to each other, through the lower wiring pad and a chip connection terminal between the lower wiring pad and the lower redistribution conductive structure.

11. The semiconductor package of claim 1, wherein the through hole has a tapered shape in which a horizontal width thereof decreases as the through hole extends from the second surface of the semiconductor substrate toward the buried power rail.

12. A semiconductor package, comprising:
a lower redistribution layer having a lower redistribution conductive structure;
a lower semiconductor chip disposed on the lower redistribution layer;
a plurality of conductive connection structures attached to the lower redistribution layer;
an upper redistribution layer having an upper redistribution conductive structure disposed on the lower semiconductor chip and the plurality of conductive connection structures; and
an upper semiconductor chip disposed on the upper redistribution layer and electrically connected to the upper redistribution conductive structure,
wherein the lower semiconductor chip comprises: a semiconductor substrate having a first surface and a second surface opposite to the first surface; a buried power rail extending from the first surface of the semiconductor substrate toward the second surface; and a through electrode extending from the second surface of the semiconductor substrate toward the first surface thereof and electrically connecting the buried power rail to the lower redistribution conductive structure,
wherein the lower semiconductor chip is provided with power through a lower power path, the lower power path being generated through the lower redistribution conductive structure, the through electrode, and the buried power rail, and
wherein the lower semiconductor chip and the upper semiconductor chip transmit and receive signals, except for power, to each other through an internal signal path defined by the upper redistribution conductive structure.

13. The semiconductor package of claim 12, wherein the upper semiconductor chip is provided with power through an upper power path, the upper power path being defined by the lower redistribution conductive structure, some of the plurality of conductive connection structures, and the upper redistribution conductive structure.

14. The semiconductor package of claim 13, wherein at least one of the upper semiconductor chip and the lower semiconductor chip transmits and receives the signals to and from an external source through an external signal path, the external signal path being defined by the lower redistribution conductive structure, some other of the plurality of conductive connection structures, and the upper redistribution conductive structure.

15. The semiconductor package of claim 14, wherein an extension length of the external signal path is greater than an extension length of the internal signal path.

16. The semiconductor package of claim 12, wherein the lower semiconductor chip is disposed on the first surface of the semiconductor substrate and further comprises: an upper wiring structure electrically connected to the upper redistribution conductive structure; and a passivation layer at least partially covering the upper wiring structure, and
a top surface of the passivation layer and top surfaces of the plurality of conductive connection structures are at the same vertical level.

17. The semiconductor package of claim 16, further comprising
a molding that at least partially surrounds the lower semiconductor chip and the plurality of conductive connection structures, on the lower redistribution layer, wherein the top surface of the passivation layer and the top surfaces of the plurality of conductive connection structures are at a same vertical level as a top surface of the molding.

18. A semiconductor package, comprising:
a lower redistribution layer having a lower redistribution conductive structure;
a plurality of external connection terminals attached to a plurality of external connection pads disposed at a bottom of the lower redistribution layer;
a lower semiconductor chip disposed on the lower redistribution layer;
a plurality of conductive connection structures attached to the lower redistribution layer;
a molding at least partially surrounding the lower semiconductor chip and the plurality of conductive connection structures, on the lower redistribution layer;
an upper redistribution layer comprising an upper redistribution conductive structure on the lower semiconductor chip, the plurality of conductive connection structures, and the molding, the upper redistribution layer having a thickness that is less than a thickness of the lower redistribution layer; and
an upper semiconductor chip having an active plane corresponding to an active plane of the lower semiconductor chip and disposed on the upper redistribution layer, the upper semiconductor chip being electrically connected to the upper redistribution conductive structure,
wherein the lower semiconductor chip comprises:
a semiconductor substrate having a first surface and a second surface opposite to the first surface;
a plurality of fin-type active regions protruding upwardly from the first surface of the semiconductor substrate;
a gate line extending in a direction crossing the plurality of fin-type active regions;
an upper wiring structure disposed on the gate line and electrically connected to the upper redistribution conductive structure;
a passivation layer at least partially covering the upper wiring structure;
a lower wiring structure at least partially covering the second surface of the semiconductor substrate and electrically connected to the lower redistribution conductive structure;
a buried power rail filling a portion of a buried rail hole extending from the first surface of the semiconductor substrate toward the second surface; and
a through electrode extending from the second surface of the semiconductor substrate to the first surface and filling a through hole that communicates with the buried rail hole, the through electrode electrically connecting the buried power rail to the lower redistribution conductive structure.

19. The semiconductor package of claim 18, wherein
the buried rail hole extends between the gate line and the through electrode, and
the through hole has a tapered shape in which a horizontal width thereof increases as the through hole extends from the buried power rail to the second surface of the semiconductor substrate.

20. The semiconductor package of claim 18, wherein
top surfaces of the plurality of conductive connection structures, a top surface of the passivation layer, and a top surface of the molding are at a same vertical level as each other.

* * * * *